US008184625B2

(12) United States Patent
Solomon et al.

(10) Patent No.: US 8,184,625 B2
(45) Date of Patent: May 22, 2012

(54) GPON MANAGEMENT SYSTEM

(75) Inventors: David Solomon, River Vale, NJ (US);
Janet Lin, Lexington, MA (US); Mike Colven, Dallas, TX (US); Mike Hare, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 505 days.

(21) Appl. No.: 11/637,807

(22) Filed: Dec. 13, 2006

(65) Prior Publication Data

US 2007/0201486 A1    Aug. 30, 2007

Related U.S. Application Data

(60) Provisional application No. 60/749,577, filed on Dec. 13, 2005.

(51) Int. Cl.
*H04Q 11/00* (2006.01)
(52) U.S. Cl. .................................................. 370/358
(58) Field of Classification Search .................. None
See application file for complete search history.

(56) References Cited

U.S. PATENT DOCUMENTS

| | | |
|---|---|---|
| 4,046,193 A | 9/1977 | Dougherty |
| 4,557,225 A | 12/1985 | Sagues |
| 4,720,850 A | 1/1988 | Oberlander |
| 4,858,069 A | 8/1989 | Hughes |
| 5,105,336 A | 4/1992 | Jacoby |
| 5,280,191 A | 1/1994 | Chang |
| 5,636,215 A | 6/1997 | Kubo |
| 5,748,445 A | 5/1998 | North |
| 5,812,373 A | 9/1998 | Hwang |
| 5,812,528 A | 9/1998 | VanDervort |
| 5,825,621 A | 10/1998 | Giannatto |
| 5,829,514 A | 11/1998 | Smith |
| 5,831,830 A | 11/1998 | Mahler |
| 5,867,494 A | 2/1999 | Krishnaswamy |
| 5,867,495 A | 2/1999 | Elliott |
| 5,953,207 A | 9/1999 | Akalu |
| 6,002,585 A | 12/1999 | Leeb |
| 6,038,129 A | 3/2000 | Falaki |
| 6,047,002 A | 4/2000 | Hartmann |
| 6,101,090 A | 8/2000 | Gates |
| 6,434,000 B1 | 8/2002 | Pandolfi |

(Continued)

FOREIGN PATENT DOCUMENTS

KR    2004063453    7/2004

OTHER PUBLICATIONS

International Search Report and a Written Opinion issued on Oct. 31, 2008 in the corresponding International PCT/US2006/047374 application.

(Continued)

*Primary Examiner* — Yong Zhou
(74) *Attorney, Agent, or Firm* — Murphy & King, P.C.

(57) ABSTRACT

The present invention provides the capability to manage NEs with a large number of units of equipment and facilities, by providing functions such profiling, auto-creation, link aggregation and scoping. This makes it easier for to manage GPON data, voice and video services and to support traffic protection. A method for managing an optical network comprises automatically provisioning a unit of the optical network, automatically creating a unit of the optical network, and arranging link aggregation in a unit of the optical network.

9 Claims, 37 Drawing Sheets

```
                                    ┌─ 1000
                                   /
   Link Aggregation
   Frame Switch Equipment supports Link Aggregation against FOEPORT:
        User can provision Link Aggregation between up to eight 1-GEPORT or
        up to four 10-GEPORT.
              Up to 8 GEPORT link aggregated for FSW4X will be allowed.
              Up to 4 GEPORT link aggregated for FSW21X will be allowed.
        1-GEPORT/10-GEPORT in different switch card (not in same card)
        support Link Aggregation when PROT=Y.
        1-GEPORT and 10-GEPORT in different bandwidth can not support Link
        Aggregation.
        Link Aggregation in PROT=Y mode has to be in pair.
              One GEPORT in one FSW and the other GEPORT in the other
              FSW.
              Mirror GEPORT pair is required. (ex. 7-1 can only in pair with 8-1)
        FOEPORT can not be deleted if there is any configuration (FACLINK,
        VGWAY, MCST) already provisioned.
```

U.S. PATENT DOCUMENTS

| | | | |
|---|---|---|---|
| 6,532,088 B1 | 3/2003 | Dantu | |
| 6,614,758 B2 | 9/2003 | Wong | |
| 6,621,818 B1 | 9/2003 | Szczepanek | |
| 6,671,818 B1 | 12/2003 | Mikurak | |
| 6,789,191 B1 | 9/2004 | Lapstun | |
| 6,972,959 B2 | 12/2005 | Asai | |
| 6,985,467 B2 * | 1/2006 | Lomp et al. | 370/335 |
| 7,020,111 B2 * | 3/2006 | Ozluturk et al. | 370/335 |
| 7,046,679 B2 | 5/2006 | Sampath | |
| 7,085,281 B2 * | 8/2006 | Thomas et al. | 370/442 |
| 7,095,611 B2 | 8/2006 | Kunz | |
| 7,103,807 B2 | 9/2006 | Bosa | |
| 7,124,101 B1 | 10/2006 | Mikurak | |
| 7,133,415 B2 | 11/2006 | Zelig | |
| 7,154,755 B2 | 12/2006 | Araujo | |
| 7,158,380 B2 | 1/2007 | Green | |
| 7,245,628 B2 * | 7/2007 | Shi et al. | 370/437 |
| 7,277,443 B2 | 10/2007 | Goode | |
| 7,283,519 B2 * | 10/2007 | Girard | 370/353 |
| 7,322,850 B2 | 1/2008 | Neer | |
| 7,376,136 B2 | 5/2008 | Song | |
| 7,403,477 B2 * | 7/2008 | Takeuchi et al. | 370/230 |
| 7,428,211 B2 | 9/2008 | Yu | |
| 7,492,719 B2 | 2/2009 | Lim | |
| 7,512,147 B2 | 3/2009 | Sato | |
| 7,599,620 B2 | 10/2009 | Graves | |
| 2002/0059637 A1 | 5/2002 | Rakib | |
| 2002/0085548 A1 | 7/2002 | Ku | |
| 2002/0141159 A1 | 10/2002 | Bloemen | |
| 2002/0196792 A1 | 12/2002 | McNeil | |
| 2002/0196811 A1 | 12/2002 | Park | |
| 2003/0091267 A1 | 5/2003 | Alvarez | |
| 2004/0064351 A1 | 4/2004 | Mikurak | |
| 2004/0107169 A1 | 6/2004 | Lowe | |
| 2004/0177161 A1 | 9/2004 | Hoang | |
| 2004/0190548 A1 | 9/2004 | Harel | |
| 2004/0202470 A1 | 10/2004 | Lim | |
| 2005/0008013 A1 | 1/2005 | Jamieson | |
| 2005/0013314 A1 | 1/2005 | Lim | |
| 2005/0099949 A1 | 5/2005 | Mohan | |
| 2005/0100015 A1 | 5/2005 | Eubanks | |
| 2005/0180749 A1 * | 8/2005 | Koley et al. | 398/45 |
| 2005/0198247 A1 | 9/2005 | Perry | |
| 2006/0098578 A1 | 5/2006 | Mallya | |
| 2006/0120389 A1 | 6/2006 | Sampath | |
| 2006/0209825 A1 * | 9/2006 | Carroll et al. | 370/390 |
| 2006/0285536 A1 | 12/2006 | Gerard Pauwels | |
| 2007/0025370 A1 * | 2/2007 | Ghasem et al. | 370/401 |
| 2007/0070997 A1 * | 3/2007 | Weitz et al. | 370/389 |
| 2007/0109974 A1 * | 5/2007 | Cutillo et al. | 370/254 |
| 2007/0136743 A1 | 6/2007 | Hasek | |
| 2007/0136777 A1 | 6/2007 | Hasek | |
| 2008/0068807 A1 | 3/2008 | Horng | |

OTHER PUBLICATIONS

Final Office Action dated Sep. 30, 2009 issued in U.S. Appl. No. 11/637,037.
Non-Final Office Action dated Mar. 11, 2009 issued in U.S. Appl. No. 11/637,037.
Non-Final Office Action dated May 5, 2009 issued in U.S. Appl. No. 11/637,808.
Final Office Action dated Oct. 16, 2009 issued in U.S. Appl. No. 11/637,808.
Non-Final Office Action dated Apr. 17, 2008 issued in U.S. Appl. No. 11/637,840.
Notice of Allowance dated Aug. 13, 2008 issued in U.S. Appl. No. 11/637,840.
Non-Final Office Action dated May 7, 2009 issued in U.S. Appl. No. 11/637,023.
Non-Final Office Action dated Jul. 23, 2009 issued in U.S. Appl. No. 11/637,041.
Notice of Allowance dated Nov. 9, 2009 issued in U.S. Appl. No. 11/637,842.
Non-Final Office Action dated May 14, 2009 issued in U.S. Appl. No. 11/637,842.
Final Office Action dated Dec. 3, 2009 issued in U.S. Appl. No. 11/637,023.
Paul Congdon, "Load Balancing Algorithms", Feb. 4, 1998, IEEE Aggregate Study Group, all pages.
IEEE Std 802.3ad-2000, "Aggregation of Multiple Link Segments", Mar. 30, 2000, IEEE, all pages.
Final Office Action dated Mar. 29, 2010 received in U.S. Appl. No. 11/637,041.
Non-Final Office Action dated Feb. 24, 2010 received in U.S. Appl. No. 11/637,808.
Non-Final Office Action dated May 18, 2010 received in U.S. Appl. No. 11/637,023.
Notice of Allowance dated Jun. 24, 2010 received in U.S. Appl. No. 11/637,037.
Final Office Action dated Jul. 20, 2010 received in U.S. Appl. No. 11/637,808.
International Search Report dated Feb. 19, 2008 received in PCT/US06/47379.
Notice of Allowance dated Sep. 23, 2010 received in U.S. Appl. No. 11/637,808.
Non-Final Office Action dated Nov. 8, 2010 received in U.S. Appl. No. 11/637,041.
Notice of Allowance dated Sep. 16, 2010 received in U.S. Appl. No. 11/637,037.
Final Office Action dated Dec. 3, 2010 received in U.S. Appl. No. 11/637,023.
Supplemental Notice of Allowability dated Oct. 19, 2010 received in U.S. Appl. No. 11/637,037.
Notice of Allowance dated Mar. 31, 2011 received in U.S. Appl. No. 11/637,041.
Non-Final Office Action dated Jan. 7, 2011 received in U.S. Appl. No. 11/637,841.
Non-Final Office Action dated Mar. 14, 2011 received in U.S. Appl. No. 11/637,023.
Final Office Action dated May 10, 2011 issued in U.S. Appl. No. 11/637,841.
Final Office Action dated Nov. 16, 2011 received in U.S. Appl. No. 11/637,023.
Non-Final Office Action dated Oct. 28, 2011 received in U.S. Appl. No. 11/637,841.

* cited by examiner

Frame Switch Equipment Naming Convention
FSWabc:
   a: stands for SPEED (4, 21....)
   b: stands for Field Pluggable
      X: for Field Pluggable
   c: stands for Version
The Frame Switch Equipment names are:
FSW4X1
FSW21X1

Fig. 4

GPON Equipment Naming Convention
GPONabcd:
   a: stands for SPEED (A..G) (refer to G984.1 section 7), R1.1 only support transmission speed. "u" is upstream, "d" is downstream.
      A: 155Mu/1.2Gd
      B: 622Mu/1.2 Gd
      C: 1.2Gu/1.2Gd
      D: 155Mu/2.4Gd
      E: 622Mu/2.4 Gd
      F: 1.2Gu/2.4 Gd (in RSA 1.25 Gu/2.5 Gd)
      G: 2.4Gu/2.4 Gd
   b: stands for # of Ports
   c: stands for Field Pluggable
      N: Non-field Pluggable
      X: Field Pluggable (for future release)
   d: stands for Version
The GPON equipment names are:
   GPONF2N1 (R1.1)
   GPONF4N1 (R2.1)

ONT Equipment Naming Convention
ONTabcd:
- a: stands for SPEED (A..G) (refer to G984.1 section 7)
  - A: 155Mu/1.2 Gd
  - B: 622Mu/1.2 Gd
  - C: 1.2Gu/1.2 Gd
  - D: 155Mu/2.4Gd
  - E: 622Mu/2.4 Gd
  - F: 1.2Gu/2.4Gd(in RSA 1.25Gu/2.5Gd)
  - G: 2.4Gu/2.4 Gd
- b: stands for Facilities supported (1..n)
  - 1: 2 VPORT, 1 EPORT, 1 MPORT, 1 RFPORT
  - 2: 2 VPORT, 1 EPORT (SBC, SFU)
  - 3: 8 VPORT, 1 EPORT, 1 RFPORT, 2 DS1
  - 4: 8 VPORT, 1 EPORT, 2 DS1 (SBC, SBU)
  - 5: 24 VPORT, 12 EPORT, 1 MPORT, 1 RFPORT, 12 VDSL (MDU)
  - 6: 24 VPORT, 12 EPORT, 12 VDSL (MDU)
  - 7: 24 VPORT, 8 EPORT, 1 MPORT, 1 RFPORT, 4 DS1 (MTU)
  - 8: 24 VPORT, 8 EPORT, 4 DS1 (MTU)
  - 9: 24 VPORT, 12 EPORT, 12 VDSL, 4 DS1(FTTC)
  - 10: 6 VPORT, 2 EPORT, 1 MPORT, 1 RFPORT (SFU)
  - 11..n for future new ONTs with different facilities combination
- c: stands for Field Pluggable
  - N: Non-Field Pluggable
  - X: Field Pluggable(for future release)
  - P: Protected Field Pluggable(for future release)
- d: stands for Version
  - Depends on "b", if # of facility supported are the same, the version will be increased.) The ONT equipment names are:

The ONT equipment names are:
- □ONTF1N1, ONT1F2N1 (R1.1, SFU)
- □ONTF3N1, ONT2F4N1 (R2.1, SBU)
- □ONTF5N1, ONT3F6N1 (R2.1, MDU)
- □ONTF7N1, ONT4F8N1 (R2.1, MTU)

ONTF9N1, ONTF10N1 (R3.1)

FSW and GPONSU Equipment Provision
FrameSWitchEquipment:
    AID=IFA1-n
    "n" is Frame Switch Slot: 7-8
    ENT-EQPT::IFA1-7:C::FSW4X1::IS; (R1.1)
    ENT-EQPT::IFA1-8:C::FSW21X1::IS; (R2.1)
    FSW Equipment can be auto-provisioned if system AUTOP=Y (default is Y).
PON OLT Equipment:
    AID=IFA1-n
    "n" is the GPONSU Slot: 3-6 & 9-14
    ENT-EQPT::IFA1-3:C::GPONF2N1::IS; (R1.1)
    ENT-EQPT::IFA1-5:C::GPONF4N1::IS; (R2.1)
    GPONSU Equipment can be auto-provisioned if system AUTOP=Y (default is Y).

Fig. 7

ONT Equipment Provision
PON ONT Equipment:
AID=IFA1-n-m-l
    "n" is the GPONSU Slot: 3-6 & 9-14
    "m" is the OLT Interface: 1-4
    "l" is ONT Interface: 1-64 for BONT and RONT
Maxi. 64 ONT can be provisioned per OLTIF.
ENT-ONTEQPT::IFA1-3-1-32:C::ONTF2N1:SERIALNO=456xx:IS;
ENT-ONTEQPT::IFA1-3-1-24:C::ONTF3N1:SERIALNO=321xx:IS;
ENT-ONTEQPT::IFA1-3-1-64:C::ONTF1N1:SERIALNO=654xx:IS;

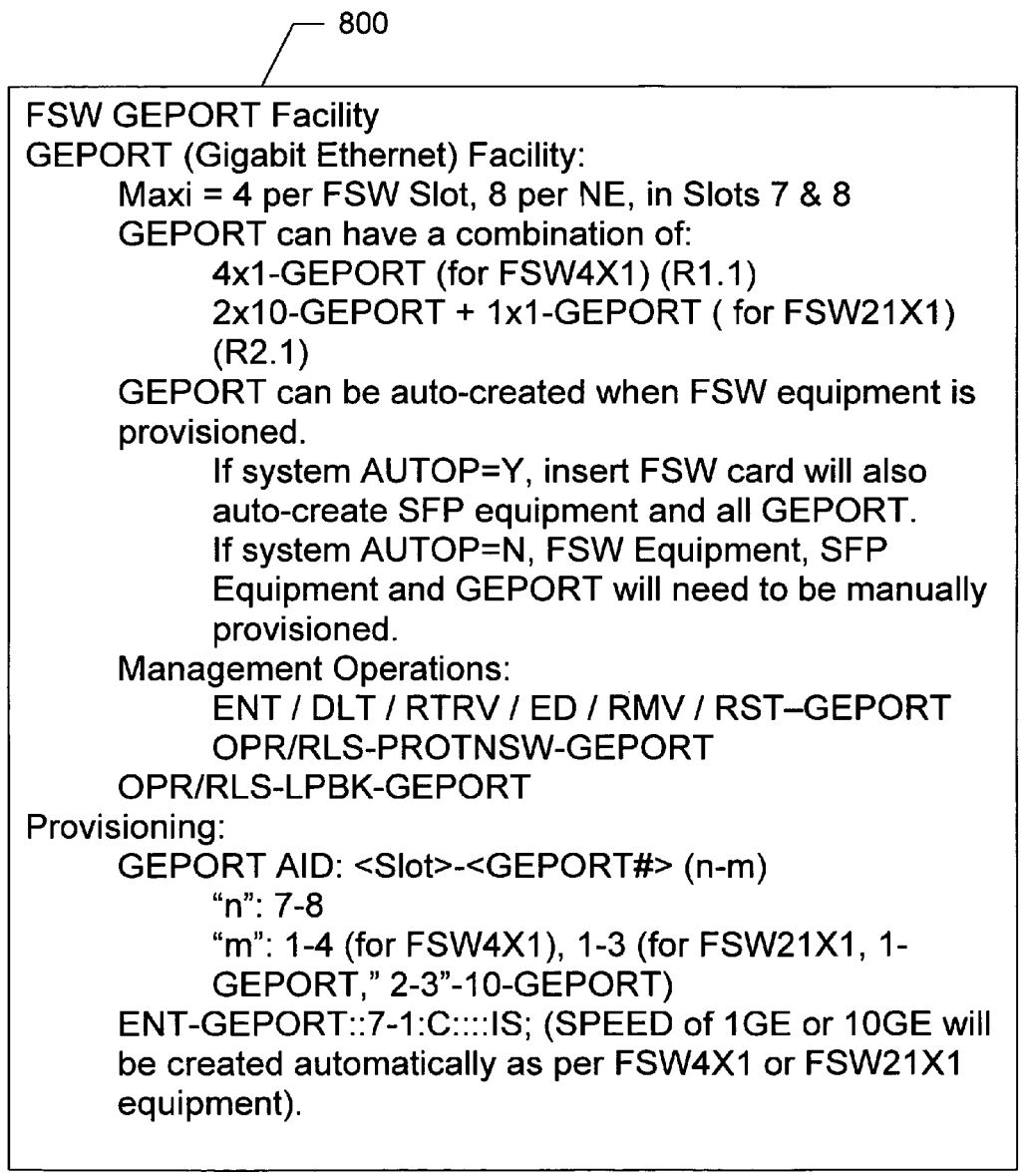

800

FSW GEPORT Facility
GEPORT (Gigabit Ethernet) Facility:
    Maxi = 4 per FSW Slot, 8 per NE, in Slots 7 & 8
    GEPORT can have a combination of:
        4x1-GEPORT (for FSW4X1) (R1.1)
        2x10-GEPORT + 1x1-GEPORT ( for FSW21X1)
        (R2.1)
    GEPORT can be auto-created when FSW equipment is provisioned.
        If system AUTOP=Y, insert FSW card will also auto-create SFP equipment and all GEPORT.
        If system AUTOP=N, FSW Equipment, SFP Equipment and GEPORT will need to be manually provisioned.
    Management Operations:
        ENT / DLT / RTRV / ED / RMV / RST–GEPORT
        OPR/RLS-PROTNSW-GEPORT
    OPR/RLS-LPBK-GEPORT
Provisioning:
    GEPORT AID: <Slot>-<GEPORT#> (n-m)
        "n": 7-8
        "m": 1-4 (for FSW4X1), 1-3 (for FSW21X1, 1-GEPORT," 2-3"-10-GEPORT)
    ENT-GEPORT::7-1:C::::IS; (SPEED of 1GE or 10GE will be created automatically as per FSW4X1 or FSW21X1 equipment).

Fig. 9

```
FSW FOEPORT Facility
FOEPORT (Frame Over Ethernet Port) Facility:
    Maxi = 8, logical entity
    FOEPORT can have a combination of:
        Non-link aggregated, LAG=OFF (GEPORT with one 1-GEPORT or
        10-GEPORT)
        Link aggregated/Unprotected, LAG=ON, PROT=N (GEPORT with
        one or more 1-GEPORT or 10-GEPORT).
        Link aggregated/Protected, LAG=ON, PROT=Y (GEPORT with two
        or more than two 1-GEPORT or 10-GEPORT).
    FOEPORT software needs to perform CAC as follows:
        ONT EPORT service
        ONT VPORT service (Group CAC)
        ONT IPTV service (Group CAC & dynamic IGMP) (R2.1)
    Management Operations:
        ENT / DLT / RTRV / ED-FOEPORT
    Provisioning:
        FOEPORT AID = <FOEPORT#> (n)
        "n": 100-107
```

Link Aggregation
Frame Switch Equipment supports Link Aggregation against FOEPORT:
  User can provision Link Aggregation between up to eight 1-GEPORT or up to four 10-GEPORT.
    Up to 8 GEPORT link aggregated for FSW4X will be allowed.
    Up to 4 GEPORT link aggregated for FSW21X will be allowed.
  1-GEPORT/10-GEPORT in different switch card (not in same card) support Link Aggregation when PROT=Y.
  1-GEPORT and 10-GEPORT in different bandwidth can not support Link Aggregation.
  Link Aggregation in PROT=Y mode has to be in pair.
    One GEPORT in one FSW and the other GEPORT in the other FSW.
    Mirror GEPORT pair is required. (ex. 7-1 can only in pair with 8-1)
  FOEPORT can not be deleted if there is any configuration (FACLINK, VGWAY, MCST) already provisioned.

FSW FOEPORT Provision
Non-Link Aggregated:
 ENT-FOEPORT::100:C:::GEPORT=7-1,LAG=OFF;
 ED-FOEPORT::100:C::ADD:GEPORT=8-1,PROT=Y;
  FOEPORT 100 becomes 1G (or 10G) of CIR bandwidth.
  GEPORT 7-1/8-1 traffic are protected.
Link-Aggregated:
 ENT-FOEPORT::101:C:::GEPORT=7-2&8-2,LAG=ON,PROT=Y;
  FOEPORT 101 becomes 1G (or 10G) of CIR bandwidth.
  GEPORT 7-2/8-2 traffic are protected if one of the FSW card is removed.
 ED-FOEPORT::101:C::ADD:GEPORT=7-4&8-4;
  FOEPORT 101 becomes 2G (or 20G) of CIR bandwidth.
  GEPORT 7-2/8-2, 7-4/8-4 traffic are protected.
 ED-FOEPORT::101:C::REMOVE:GEPORT=7-4&8-4;
  FOEPORT 101 becomes 1G (or 10G) of CIR bandwidth.
  GEPORT 7-4/8-4 traffic are protected.
 ENT-FOEPORT::102:C:::GEPORT=7-3&8-3,LAG=ON,PROT=N;
  FOEPORT 102 becomes 2G (or 20G) of CIR bandwidth.
  GEPORT 7-3/8-3 traffic are not protected.

FSW GEPORT Protection
GEPORT Facility Protection:
  GEPORT supports facility protection only when GEPORT is linked aggregated through ENT-FOEPORT with more than one GEPORT port.
  If PROT=Y for the link aggregation, the traffic is routed to the mirror port. Ex. Protection of 7-1 will route traffic to 8-1.
  If PROT=N for the link aggregation, the traffic can be routed to any link aggregated GEPORT.
  Protection can be released by RLS-PROTNSW-GEPORT command or by auto-protection happened to the routed protection GEPORT.
Provisioning:
  GEPORT AID: <Slot>-<GEPORT#> (n-m)
    "n": 7-8
    "m": 1-4 (for 4G FSW), 1-3 (for 21G FSW, 1-GEPORT," 2-3"-10-GEPORT)
  OPR-PROTNSW-GEPORT::7-1:C::MAN;

GPON OLTIF Facility
OLTIF (OLT Interface) Facility:
  Maxi = 2 per GPONSU, 20 per NE in R1.1.
  Maxi = 4 per GPONSU, 40 per NE in R2.1.
  If system AUTOP=Y and GPONSU card is in the shelf, both GPONSU and OLTIFs will be auto-created.
  If system AUTOP=Y and FSW is not in the shelf, only GPONSU equipment will be provisioned. OLTIF will not be auto-created until user insert FSW equipment trigger OLTIFs creation.
  If system AUTOP=N, both GPONSU Equipment and OLTIFs will need to be manually provisioned.
  OLTIF software needs to perform CAC as follows:
    ONT EPORT service
    ONT IPTV service (dynamic IGMP) (R2.1)
    ONT VPORT service (130K)
    ONT T1 service (2M?)
  Management Operations:
    ENT / DLT / RTRV / ED-OLTIF
Provisioning:
  OLTIF AID: <Slot>-<OLT Interface> (n-m)
    "n": 3-6 & 9-14 & "m": 1-4
    ENT-OLTIF::3-1:C::::IS;

Fig. 14

```
1400
GPON ONT ONTIF Facility
ONTIF (ONT Interface) Facility:
    Maxi = 1 per ONT, 32 per OLTIF for RONT (R1.1)
    Maxi = 1 per ONT, 64 per OLTIF for BONT (R2.1)
    Maxi 32 * 2 * 10 = 640 per NE in R1.1
    Maxi 64 * 4 * 10 = 2560 per NE in R2.1
    ONTIF will always be auto-created/auto-deleted when ONT equipment is
    created/deleted.
    User can only edit or retrieve ONTIF (not ENT/DLT) facility.
    Management Operations:
        RTRV / ED-ONTIF
Provisioning:
    ONTIF AID: <Slot>-<OLT Interface>-<ONT #>-<ONT Interface #> ("n-m-l"
    is ONT Equipment AID) (n-m-l-p)
        "n": 3-6 & 9-14
        "m": 1-4
        "l": 1-64
        "p": 1
```

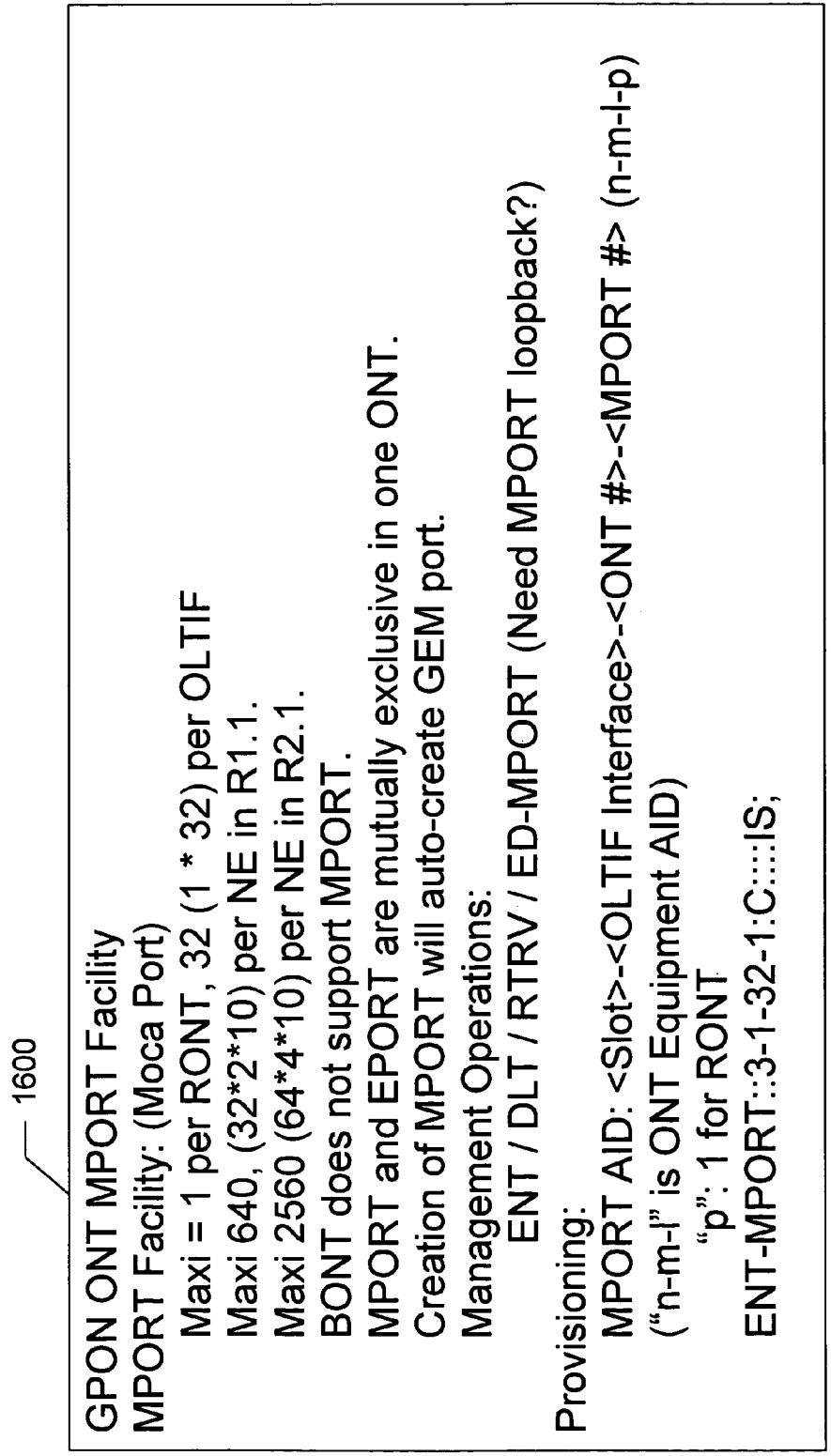

Fig. 16

GPON ONT MPORT Facility
MPORT Facility: (Moca Port)
  Maxi = 1 per RONT, 32 (1 * 32) per OLTIF
  Maxi 640, (32*2*10) per NE in R1.1.
  Maxi 2560 (64*4*10) per NE in R2.1.
  BONT does not support MPORT.
  MPORT and EPORT are mutually exclusive in one ONT.
  Creation of MPORT will auto-create GEM port.
  Management Operations:
    ENT / DLT / RTRV / ED-MPORT (Need MPORT loopback?)
Provisioning:
  MPORT AID: <Slot>-<OLTIF Interface>-<ONT #>-<MPORT #> (n-m-l-p)
  ("n-m-l" is ONT Equipment AID)
    "p": 1 for RONT
    ENT-MPORT::3-1-32-1:C:::IS;

GPON ONT GEM Port Facility
GEM Port PM Facility:
  Maxi = 2 per RONT, 64 (1 * 32) per OLTIF
  Maxi 4094(for EPORT/MPORT) + 2560 (for VPORT, 1*64*4*10) = 6654 per NE in R1.1.
  GEM port will be auto-created when EPORT/MPORT/VPORT is created.
Management Operations:
  ED/RTRV-GEM
Provisioning:
  GEM AID: <Slot>-<OLTIF Interface>-<ONT #>-<GEM #> (n-m-l-p) ("n-m-l" is ONT Equipment AID) (n-m-l-p)
  "p": 1 for EPORT or MPORT
  "p": 101 for VPORT
  RTRV-GEM::3-1-32-1:C;
  RTRV-GEM::3-1-32-101:C:

```
GPON ONT VPORT Facility
VPORT (Voice Port) Facility:
        Maxi = 2 per RONT, 64(2 * 32) per OLTIF (R1.1)
        Maxi = 24 per BONT, 1536 (24*64) per OLTIF (R2.1)
        Maxi 5120 (4 * 64 * 2 * 10) per NE in R1.1.
        Maxi 10240 (4 * 64 * 4 * 10 ) per NE in R2.1
        The first created VPORT will auto-create GEM port.
        The last deleted VPORT will auto-delete GEM port.
        Management Operations:
                ENT / DLT / RTRV / ED-VPORT
                ENT/DLT/RTRV / ED-VGWAY (support 2 VGWAY in R1.1)
        VPORT will be created without link to any VGWAY. Service
        provider will need to VPORT link to a specific VGWAY to move
        VPORT state out of SEGO.
Provisioning:
        VPORT AID: <Slot>-<OLTIF Interface>-<ONT #>-<VPORT #> (n-
        m-l-p) ("n-m-l" is ONT Equipment AID)
                "p": 1..2 for RONT, 1..24 for BONT.
        ENT-VPORT::3-1-32-2:C::::IS;
        ED-VPORT::3-1-32-2:C:::VGWAY=1;
GEM port can only be auto-created in Odd # no matter 3-1-32-1 or 3-1-32-
2 created first. (GEM 3-1-32-1 will be created.)
Assume EPORT bridging with neighbor EPORT only.
        Ex. EPORT 3-1-32-1 & 3-1-32-2 are bridging together.
        New keyword (BRDG) will be added in EPORT to show the bridged
        EPORT AID.
Assume EPORT can bridge any Bridged Even # EPORT.
        RTRV-EPORT::3-1-32-1:C; shows BRDG=3-1-32-2.
        ED-EPORT::3-1-32-1:C:::BRDG=NONE; (release 3-1-32-2)
        RTRV-EPORT::3-1-32-3:C; shows BRDG=3-1-32-4.
        ED-EPORT::3-1-32-3:C::BRDG=3-1-32-2;
        RTRV-EPORT::3-1-32-3:C; shows BRDG=3-1-32-4&3-1-32-2.
Assume EPORT can bridge any Bridged Odd/Even # of EPORT.
        Service provider needs to manually delete GEM port if EPORT is
        the last in the bridge.
        DLT-GEM::3-1-32-1:C; (Assume EPORT 3-1-32-2 removed)
        RTRV-EPORT::3-1-32-3:C; shows BRDG=3-1-32-4.
        ED-EPORT::3-1-32-3:C::BRDG=3-1-32-1;
        RTRV-EPORT::3-1-32-3:C; shows BRDG=3-1-32-4&3-1-32-1.
```

Fig. 19

```
GPON ONT RFPORT Facility
RFPORT (Radio Frequency) Facility:
    Maxi = 1 per RONT/BONT, 32 (1*32) per OLTIF
    Maxi 640 (1*32*2*10) per NE in R1.1
    Maxi 2560 (1*64*4*10) per NE in R2.1
    Management Operations:
        ENT / DLT / RTRV / ED-RFPORT
Provisioning:
    RFPORT AID: <Slot>-<OLTIF Interface>-<ONT #>-<RFPORT #> (n-m-l-
    p) ("n-m-l" is ONT Equipment AID)
        "p": 1
    ENT-RFPORT::3-1-32-1:C::::IS;
```

GPON ONT DS1 Facility
DS1 Facility:
  Maxi = 4 per BONT, 256 (4*64) per OLTIF (R2.1)
  DS1 is not applicable for RONT.
  HW Limitation for GPONSU to/from ONT is maxi. 84 DS1.
  Maxi = 840 (84*10) per NE in R2.1.
  Management Operations:
    ENT / DLT / RTRV / ED / RMV / RST-T1
    OPR/RLS-LPBK-T1
    CONN/DISC-TSTSIG-T1
Provisioning:
  TL1 AID: <Slot>-<OLTIF Interface>-<ONT #>-<T1 #> (n-m-l-p) ("n-m-l" is
  ONT Equipment AID)
  "p": 1..4 for BONT
  ENT-T1::3-1-32-1:C::::IS;

Fig. 22

```
GPON ONT Binding Facilities Supported
FACLINK Facility:
    There are up to four flows (with same SVID) supported for each
    EPORT/MPORT.
    Each OLTIF can support up to 256 policing (HW FPGA limitation in
    R1.1/R2.1).
    Maxi = 1 * 4 per RONT, 128(1 * 4 * 32) per OLTIF in R1.1
    Maxi = 12 * 4 per BONT, 3072(12 * 4 * 64) per OLTIF in R2.1.(may be
    limited by NE limitation)
    Mix BONT/RONT can support up to 10240 (256 * 4 * 10) FACLINK per
    NE (limited by # SVID supported).
VT Cross Connect Facility:
    Maxi = 4 per BONT,256 (4 * 64)
    Maxi = 840 (84 * 10)
    VTXconn is only used for DS1 service.
```

GPON ONT FACLINK Facility
ONT FACLINK Facility:
  SVID is not partition.
    SVID can be provisioned by EPORT, MPORT (using FACLINK command) and VGWAY, MCST (not using FACLINK command) services.
  FACLINK needs to support both EGRESS and INGRESS traffic parameters asymmetrically.
  ENT-FACLINK::3-1-64-1-1-1:C:::FOEPORT=100,SCLASS=C,INPRI=3,CIR=35,EEIR=50,SVID=5;
  FACLINK software needs to check the followings to accept or fail the FACLINK command:
    Check EPORT (3-1-64-1) or MPORT (3-1-64-1) and FOEPORT(100) existence.
    Check SVID (value 5) uniqueness in the whole NE (against up to 8FOEPORTs).
    Perform CAC against specified FOEPORT bandwidth (1G .. 40G) with available bandwidth to be allocated.
    Perform CAC against specified OLTIF bandwidth (1.2G or 2.4G) with available bandwidth to be allocated.

Fig. 24

```
— 2400
FACLINK Facility Configuration
ENT-FACLINK::3-1-64-1-1-1:C:::FOEPORT=100, SCLASS=C,INPRI=3,
CIR=35,EEIR=50,SVID=5;
Major Attributes:
    FOEPORT: FOEPORT AID
    CIR, EIR, ECIR, EEIR: 0..100 , INPRI, SCLASS, PRI
    SVID: 1..4094 (some SVID can be used by VGWAY & MCST)
System Objects:
    FACLINK
Management Operations:
    FACLINK : ENT / DLT / RTRV / ED
TL1 AIDs:
    <Slot>-<OLTIF Interface>-<ONTIF Interface>-<GEM #>-<Customer Flow>-
    <Classifier>
    AID=n-m-l-p-x-y ("n-m-l-p" is EPORT or MPORT AID)
        "n": 3-6 & 9-14
        "m": 1-4
        "l": 1-64
        "p": 1-12 for EPORT, 1 for MPORT
        "x": 1 in this release
        "y": 1-4 (support up to 4 classifier)
```

Fig. 26

```
GPON ONT VT/VTXconFacility
ONT VT/VT XCON:
  VT AID = n-m-l-r-x-y-z ("n-m-l-r" is DS1 AID)
    "x" is the STS #: 1
    "y" is the VT group: 1
    "z" is the VT #: 1

ENT-CRS-VT1::1-1-1-1,3-1-16-1-1-1-1:C;
ENT-CRS-VT1::1-1-1-2,3-1-16-2-1-1-1:C;
ENT-CRS-VT1::1-1-1-3,3-1-16-3-1-1-1:C;
ENT-CRS-VT1::1-1-1-4,3-1-16-4-1-1-1:C;
```

ONT Equipment AID:
  Four fields (IFA1-3-1-64) vsshelf equipment of 2 fields (IFA1-7) and SFP equipment of 3 fields(IFA1-7-1).
EPORT AID:
  Two fields (3-1) vs Four fields (3-1-64-1)
DS1 (T1) AID:
  Two fields (3-1) vs Four fields (3-1-16-1)
FACLINK AID:
  Four fields (3-1-1-1) vs Six fields (3-1-64-1-1-1)
VT XCON AID:
  Four fields (3-1-1-1) vs Seven fields (3-1-16-1-1-1-1) as per EPORT VT (instead of T1 VT).

Fig. 29

```
PROFILE Keyword for ONT Profile provision:
Format:Eaa-Mbb-Rxx-Vyy-Tzz(sequence does not matter, prefix does). Any new facilities can be extended in the keyword.
PRFL=E12-M1-R1-V4 or R1-V2-E5 or T2-E3 or V6...  are acceptable.
Eaa: EPORT,aa= 1..12 (for BONT),aa= 1 (for RONT)
Mbb: MPORT, bb = 1 (for RONT)
Rxx: RFPORT,xx= 1 (for either BONT or RONT)
Vyy: VPORT,yy= 1..24 (for BONT),yy= 1..4 (for RONT)
Tzz: T1,zz=1..4 (for BONT), NA (for RONT)
```

```
RTRV-ONTPRFL::503:C;
    "503:EPORT:SPEED=100" (10/100)
    "503:EPORT:DUPLEX=FULL" (FULL/HALF)
    "503:EPORT:AUTONEG=ON" (ON/OFF)
    "503:EPORT:FRCCOLL=N" (N/Y)
    "503:EPORT:MTU=1522" (1522..2000)
    "503:EPORT:MCST=NONE" (NONE/1))
    "503:EPORT:STATUS=LOCK;
    "503:MPORT:STATUS=LOCK"
    "503:T1:FMT=ESF" (UNFR/DLC16/SF/ESF)
    "503:T1:LBO=D1" (D1/D2/D3/D4/D5)
    "503:T1:IBLPBK=N" (Y/N)
    "503:T1:FEPM=N" (Y/N)
    "503:VPORT:VGWAY=NONE"
    "503:VPORT:STATUS=LOCK"
    "503:RFPORT:STATUS=UNLOCK"
```

For ONTF1N1:
 ENT-ONTPRFL::110:C:::PRFL=E1-V2-R1;
  Create 1 EPORT, 2 VPORT, and 1 RFPORT.
 ED-ONTPRFL::110:C:::EPORT:MTU=1522;
 ENT-ONTEQPT::IFA1-3-1-32:C::ONTF1N1:SERIALNO=456xx,ONTPRFL=110:IS;
For ONTF5N1:
 ENT-ONTPRFL::515:C:::PROFILE=E2-V20-T2-R1;
  Create 2 EPORT, 20 VPORT, 2 T1 and 1 RFPORT
 ED-ONTPRFL::515:C:::T1:LINECDE=AMI;
 ENT-ONTEQPT::IFA1-3-1-16:C::ONTF5N1:SERIALNO=123xx,ONTPRFL=515:IS;

```
ENT-EQPT::IFA1-7:C::FSW4X;
    SFP Equipment (IFA1-7-1&&IFA1-7-4) are auto-created.
    GEPORT (7-1&&7-4) are auto-created.
ENT-EQPT::IFA1-8:C::FSW4X;
    SFP Equipment (IFA1-8-1&&IFA1-8-4) are auto-created.
    GEPORT (8-1&&8-4) are auto-created.
ENT-EQPT::IFA1-3:C::GPONF2N1::IS;
    OLTIFs (3-1&&3-2) are auto created.
ENT-ONTEQPT::IFA1-3-1-16:C::ONTF1N1:SERIALNO=123xx:IS;
    This is not user initiated command but automatically created.
    ONT Interface (#16) is automatically assigned by OLTIF.
    ONT Default Profile AID 100 is used to created ONTIF (3-1-16-1), EPORT(3-1-16-1), RFPORT
    (3-1-16-1), and VPORT (3-1-16-1&&3-1-16-2) are auto-created with STATUS=LOCK.
ENT-FOEPORT::100:C::GEPORT=7-1;
ED-EPORT::3-1-16-1:C:::STATUS=UNLOCK;
ENT-FACLINK::3-1-16-1-1:C:::FOEPORT=100,SCLASS=A,PRI=3,CIR=35,SVID=5;
    This command binds GEM port (autocreated3-1-16-1) and FOEPORT (100).
```

```
ENT-EQPT::IFA1-7:C::FSW4X;
ENT-EQPT::IFA1-8:C::FSW4X;
ENT-EQPT::IFA1-7-1&&IFA1-8-4:C::1000X::IS;
ENT-GEPORT::7-1&8-1:C:::IS;
ENT-FOEPORT::101:C::GEPORT=7-1&8-1,PROT=Y,LAG=ON;
ENT-VGWAY::1:C::IPADDR=192.168.0.0,VIPADDR=x.x.x.x,FOEPORT=101,SVID=4093,PRTCL=H248,RSVDBW=500;
ENT-EQPT::IFA1-3:C::GPONF4N1::IS;
ENT-OLTIF::3-1&&3-2:C;
ENT-ONTPRFL::501:C::PRFL=V4-E1;
ENT-ONTEQPT::IFA1-3-1-16:C::ONTF5N1:SERIALNO=123xx,ONTPRFL=501:IS;
ONTIF (3-1-16-1), EPORT(3-1-16-1) and VPORT (3-1-16-1&&3-1-16-4) are auto-created with STATUS=LOCK.
ED-VPORT::3-1-16-1:C::VGWAY=1,STATUS=UNLOCK;
```

```
ENT-EQPT::IFA1-7:C::FSW21X;
ENT-EQPT::IFA1-8:C::FSW21X;
ENT-EQPT::IFA1-7-1&&IFA1-8-3:C::1000SX::IS;
ENT-GEPORT::7-2&8-2:C:::ISL
ENT-FOEPORT::103:C::GEPORT=7-2&8-2,PROT=N;
ENT-MCST::1:C::DHCPADDR=x.x.x.x,IPADDR=y.y.y.y,FOEPORT=103,SVID=4092,RSVDBW=700;
ENT-MCST-CH::1&&512:C::CHBW=2;
ENT-EQPT::IFA1-3:C::GPONF4N1::IS;
ENT-OLTIF::3-1&&3-4:C;
ED-ONTPRFL::600:C::PRFL=V12-E10-T2;
ED-ONTPRFL::600:C::T1:LINECDE=AMI;
ENT-ONTEQPT::IFA1-3-1-16:C::ONTF6N1:SERIALNO=123xx,ONTPRFL=600:IS;
  ONTIF (3-1-16-1), EPORT(3-1-16-1&&3-1-16-10), VPORT (3-1-16-1&&3-1-16-12), and T1(3-1-
  16-1&&3-1-16-2) are auto-created.
ED-EPORT::3-1-16-1:C:::MCST=1,STATUS=UNLOCK;
```

```
ENT-EQPT::IFA1-1:C::OC3SM::IS;
ENT-EQPT::IFA1-2:C::OC3SM::IS;
ENT-OC3::1-1&2-1:C::::IS;
ENT-EQPT::IFA1-3:C::GPONF4N1::IS;
ENT-OLTIF::3-1&&3-4:C;
ENT-ONTPRFL::711:C:::PRFL=V10-E12-T4;
ENT-ONTEQPT::IFA1-3-1-16:C::ONTF7N1:SERIALNO=123xx,ONTPRFL=711:IS;
  ONTIF (3-1-16-1), EPORT(3-1-16-1&&3-1-16-12), VPORT (3-1-16-1&&3-1-16-10), and T1(3-1-
  16-1&&3-1-16-4) are auto-created.
ED-T1::3-1-16-1:C:::STATUS=UNLOCK;
ENT-CRS-VT1::1-1-1,3-1-16-1-1-1:C;
ENT-CRS-VT1::1-1-2,3-1-16-2-1-1-1:C;
ENT-CRS-VT1::1-1-3,3-1-16-3-1-1-1:C;
ENT-CRS-VT1::1-1-4,3-1-16-4-1-1-1:C;
```

GPON MANAGEMENT SYSTEM

CROSS-REFERENCE TO RELATED APPLICATIONS

This application claims the benefit of provisional application 60/749,577, filed Dec. 13, 2005, the entirety of which is incorporated herein by reference.

BACKGROUND OF THE INVENTION

1. Field of the Invention

The present invention relates to a method and system for providing the capability to manage network elements with a large number of units of equipment and facilities, by providing functions such profiling, auto-creation, link aggregation and scoping.

2. Background of the Prior Art

A Passive Optical Network (PON) is a point-to-multipoint, fiber to the premises network architecture in which unpowered optical splitters are used to enable a single optical fiber to serve multiple premises, typically 32. A PON includes network elements, such as an Optical Line Termination (OLT) at the service provider's central office, one or more Optical Network Terminations (ONTs), and a number of Optical Network Units (ONUs) near end users. There are a number of standard types of PON that have been implemented. ATM Passive Optical Network (APON) was the first Passive optical network standard. It was used primarily for business applications, and was based on ATM. Broadband PON (BPON) is a standard based on APON. It adds support for WDM, dynamic and higher upstream bandwidth allocation, and survivability. Gigabit PON (GPON) is an evolution of BPON. It supports higher rates, enhanced security, and choice of Layer 2 protocol (ATM, GEM, Ethernet).

The network elements (NEs) in such synchronous and passive optical networks include MCUs that control the operation of the element. Existing NEs only support a limited number of equipment and facilities. A GPON ONT will need to support more than 200 times the equipment and facilities than existing NEs can support. A need arises for a technique by which NEs with such a large number of units of equipment and facilities may be managed.

SUMMARY OF THE INVENTION

The present invention provides the capability to manage NEs with a large number of units of equipment and facilities, by providing functions such profiling, auto-creation, link aggregation and scoping. This makes it easier for to manage GPON data, voice and video services and to support traffic protection.

A method for managing an optical network comprises automatically provisioning a unit of the optical network, automatically creating a unit of the optical network, and arranging link aggregation in a unit of the optical network. The provisioning step comprises automatically provisioning a unit of the optical network using a defined profile for the unit. The defined profile comprises information defining operational parameters of the unit of the optical network. The information defining operational parameters of the unit of the optical network comprises at least one of a type of a port of the unit of the optical network, a speed of a port of the unit of the optical network, a protection of a port of the unit of the optical network, and a format of a port of the unit of the optical network. The creating step comprises automatically creating a unit of the optical network using information defining operational parameters of the optical network in communicating with the created unit. The information defining operational parameters of the unit of the optical network comprises at least one of a network address of the unit of the optical network, a type of the unit of the optical network, a network function of the unit of the optical network, a protection of the unit of the optical network, and a port of the unit of the optical network. The link aggregation arranging step comprises automatically arranging link aggregation in a unit of the optical network using information defining operational parameters of the link aggregation. The information defining operational parameters of the link aggregation comprises at least one of ports included in the link aggregation, a speed of the link aggregation, a format of the link aggregation, and a protection of the link aggregation.

BRIEF DESCRIPTION OF THE DRAWINGS

FIG. 3 is an exemplary format of a Frame Switch Equipment Naming Convention.

FIG. 4 is an exemplary format of a GPON Equipment Naming Convention.

FIG. 5 is an exemplary format of an ONT Equipment Naming Convention.

FIG. 6 is an exemplary format of an FSW and GPONSU Equipment Provision.

FIG. 7 is an exemplary format of an ONT Equipment Provision.

FIG. 8 is an exemplary format of an FSW GEPORT Facility.

FIG. 9 is an exemplary format of an FSW FOEPORT Facility.

FIG. 10 is an exemplary format of a Link Aggregation Facility.

FIG. 11 is an exemplary format of an FSW FOEPORT Provision.

FIG. 12 is an exemplary format of an FSW GEPORT Protection.

FIG. 13 is an exemplary format of a GPON OLT Interface (OLTIF) Facility.

FIG. 14 is an exemplary format of a GPON ONT Interface (ONTIF) Facility.

FIG. 16 is an exemplary format of a GPON ONT MPORT Facility.

FIG. 17 is an exemplary format of a GPON ONT GEM Port Facility.

FIG. 18 is an exemplary format of a GPON ONT Voice Port (VPORT) Facility.

FIG. 19 is an exemplary format of a GPON ONT Radio Frequency (RFPORT) Facility.

FIG. 20 is an exemplary format of a GPON ONT Radio DS1 Facility.

FIG. 22 is an exemplary format of supported GPON ONT Binding Facilities.

FIG. 23 is an exemplary format of a GPON ONT FACLINK Facility.

FIG. 24 is an exemplary format of a FACLINK Facility Configuration.

FIG. 26 is an exemplary format of a GPON ONT VT/VTXcon Facility.

FIG. 28 is an exemplary format of Existing Equipment and Facility's AID Changes for GPON Service.

FIG. 29 is an exemplary format of an ONT Facilities Profile.

FIG. 30 is an exemplary format of an ONTPRFL Behavior.

FIG. 31 is an exemplary format of a user ONT Profile used for ONT Equipment Creation.

FIG. 34 is an exemplary flow diagram of an EPORT Service Provision sequence.

FIG. 35 is an exemplary flow diagram of a VPORT Service Provision sequence (without DHCP).

FIG. 36 is an exemplary flow diagram of a Multicast (IPTV) Service Provision sequence (with DHCP).

FIG. 37 is an exemplary flow diagram of a T1 Service Provision sequence.

DETAILED DESCRIPTION OF THE PREFERRED EMBODIMENTS

Figure 1:
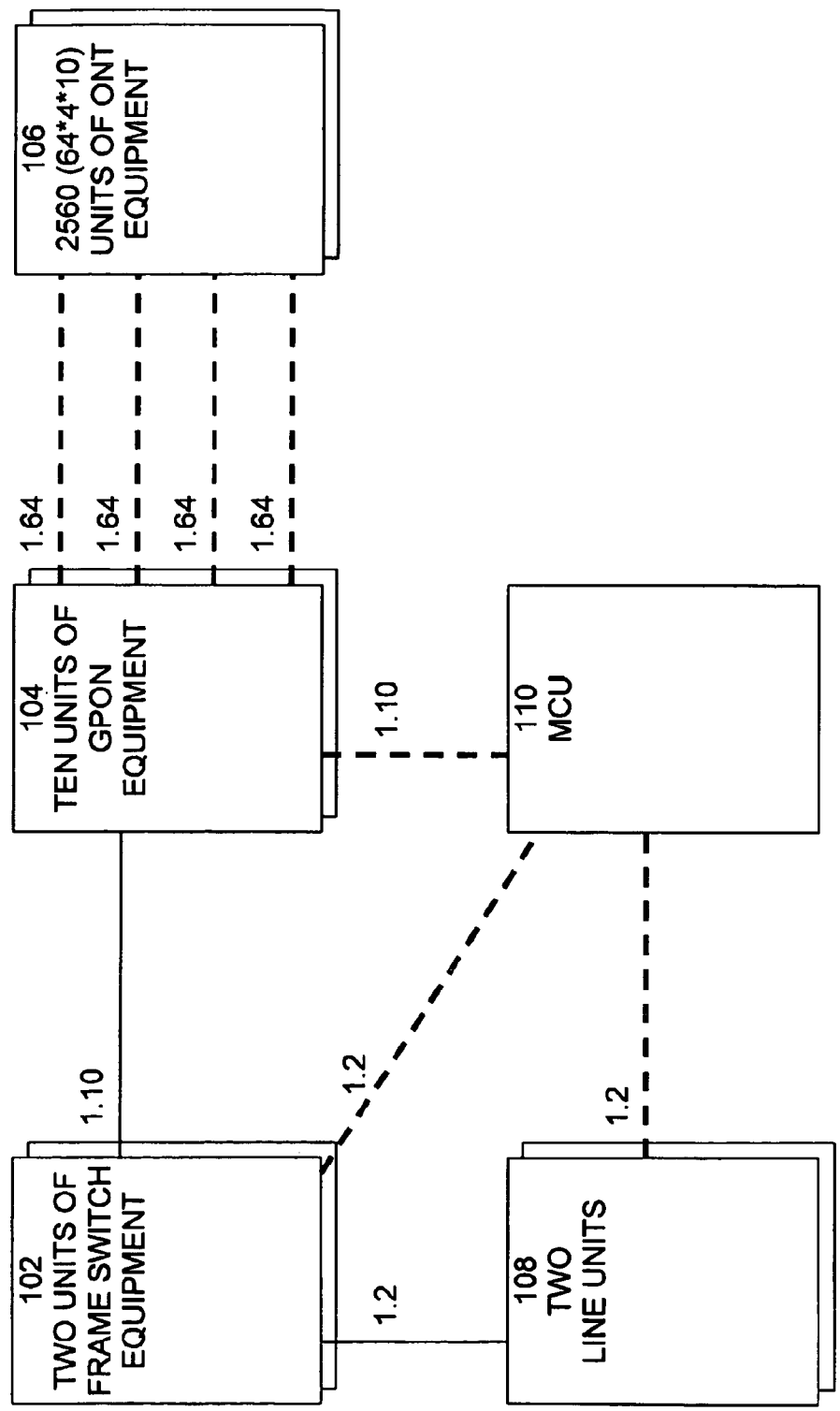
FIG. 1 is an exemplary block diagram of a system in which the present invention may be implemented.

An example of a system in which the present invention may be implemented is shown in FIG. 1. In this example, equipment used to implement a GPON includes frame switch equipment 102, GPON service unit equipment 104, ONT equipment 106, Line Units (LUs) 108, and Master Control Unit 110. Frame Switch (SW) Equipment 102 includes up to two units per Network Element (NE). Each Frame Switch Equipment 102 can support four 1 Gbps Gigabit Ethernet Ports (GEPORT) or two 10 Gbps GEPORTs and one 1 Gbps GEPORT. Each GEPORT supports SFP equipment. GPONSU Equipment 104 includes up to ten units per NE. Each GPONSU Equipment 104 can support two or four OLTIF Ports. GPONSU Equipment 104 Speeds include 1.2 Gbps/2.4 Gbps. ONT Equipment 106 (Residental: RONT) include up to 640 or 2560 units per NE. Each ONT Equipment 106 supports the following facilities: one to twelve Ethernet (EPORT) Facilities, one MoCa (MPORT) Facility, one to twenty-four Voice (VPORT) Facilities, one Video Frequency (RFPORT) Facility and one to four DS1 (T1) Facilities. RONT Equipment Speeds include 1.2 Gbps/2.4 Gbps.

Figure 2:
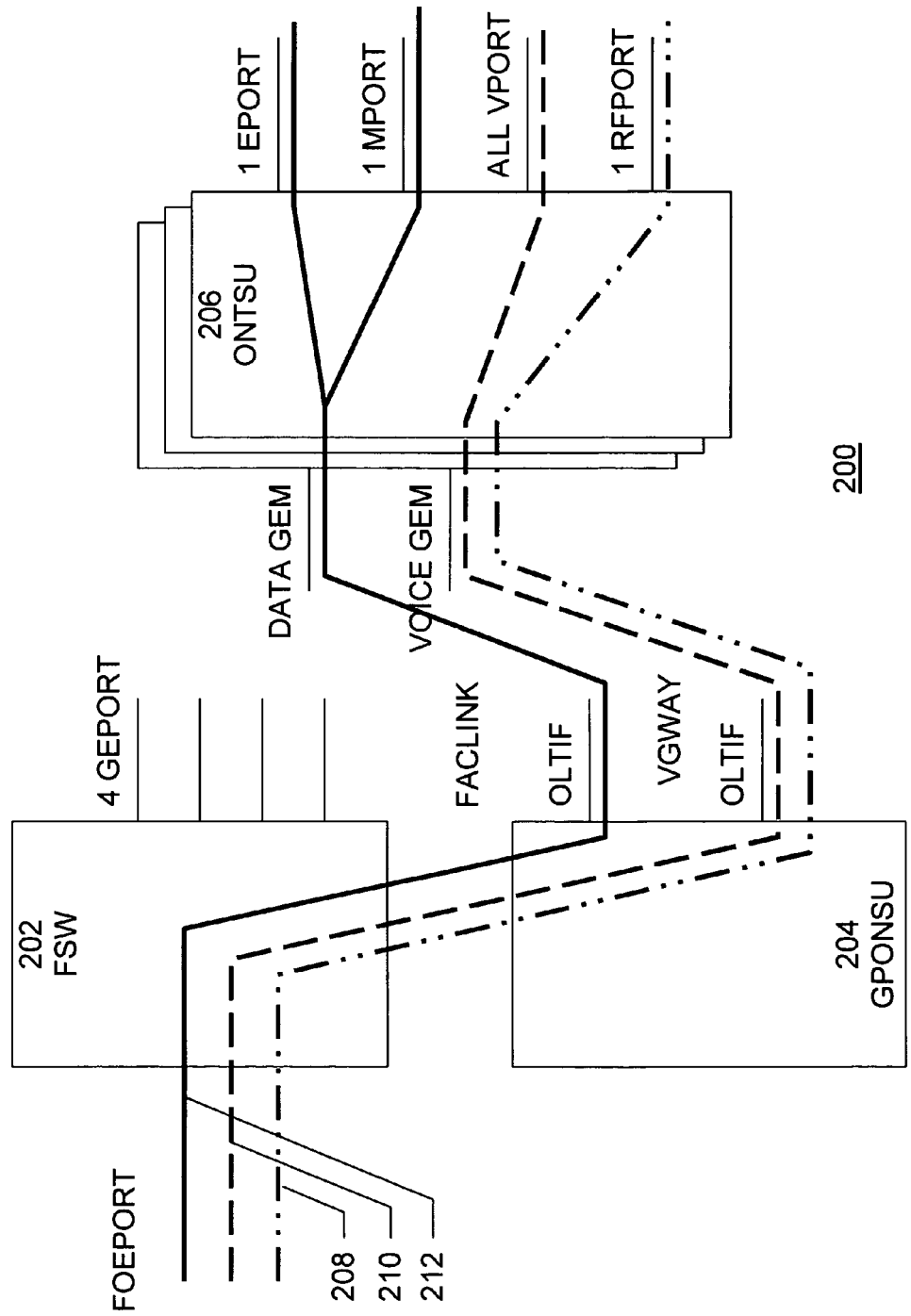
FIG. 2 is an exemplary data flow diagram of a GPON Equipment/Facility and Traffic Flow in such a facility.

An example of a GPON Equipment/Facility 200 and Traffic Flow in such a facility is shown in FIG. 2. Facility 200 includes one or more units of Frame Switching Equipment 202, one or more GPON Service Units (GPONSU) 204, and one or more Optical Network Termination Service Units (ONTSUs) 206. Data traffic 208 is routed via FSW 202, the FACLINK OLTIF of GPONSU 204, the data GEM port of ONTSU 206, and the EPORT and/or MPORT of ONTSU 206. Voice traffic 210 is routed via FSW 202, the VGWAY OLTIF of GPONSU 204, the voice GEM port of ONTSU 206, and the VPORTs of ONTSU 206. Radio traffic 212 is routed via FSW 202, the VGWAY OLTIF of GPONSU 204, the voice GEM port of ONTSU 206, and the RFPORT of ONTSU 206.

An exemplary format 300 of a Frame Switch Equipment Naming Convention is shown in FIG. 3. Format 300 includes fields for speed, field pluggability, and version.

An exemplary format 400 of a GPON Equipment Naming Convention is shown in FIG. 4. Format 400 includes fields for speed, a number of ports, field pluggability, and version.

An exemplary format 500 of an ONT Equipment Naming Convention is shown in FIG. 5. Format 500 includes fields for speed, facilities supported, field pluggability, and version.

An exemplary format 600 of an FSW and GPONSU Equipment Provision is shown in FIG. 6. Format 600 includes fields for specifying provisioning or auto-provisioning for FSW and GPONSU Equipment.

An exemplary format 700 of an ONT Equipment Provision is shown in FIG. 7. Format 700 includes fields for specifying provisioning or auto-provisioning for ONT Equipment.

An exemplary format 800 of an FSW GEPORT Facility is shown in FIG. 8. Format 800 includes fields for specifying supported GEPORTs and for provisioning the GEPORTs.

An exemplary format 900 of an FSW FOEPORT Facility is shown in FIG. 9. Format 900 includes fields for specifying supported FOEPORTs and for provisioning the FOEPORTs.

An exemplary format 1000 of a Link Aggregation Facility is shown in FIG. 10. Format 1000 includes fields for specifying the ports to be aggregated and for provisioning the Link Aggregation.

An exemplary format 1100 of an FSW FOEPORT Provision is shown in FIG. 11. Format 1100 includes fields for specifying, for Link-Aggregated and Non-Link Aggregated ports, the ports to be provisioned and the provisioned parameters for the ports.

An exemplary format 1200 of an FSW GEPORT Protection is shown in FIG. 12. Format 1200 includes fields for specifying GEPORT Facility Protection and for provisioning the GEPORT Protection.

An exemplary format 1300 of a GPON OLT Interface (OLTIF) Facility is shown in FIG. 13. Format 1300 includes fields for specifying the GPON OLTIF Facility and for provisioning the GPON OLTIF Facility.

An exemplary format 1400 of a GPON ONT Interface (ONTIF) Facility is shown in FIG. 14. Format 1400 includes fields for specifying the GPON ONTIF Facility and for provisioning the GPON ONTIF Facility.

Figure 15:
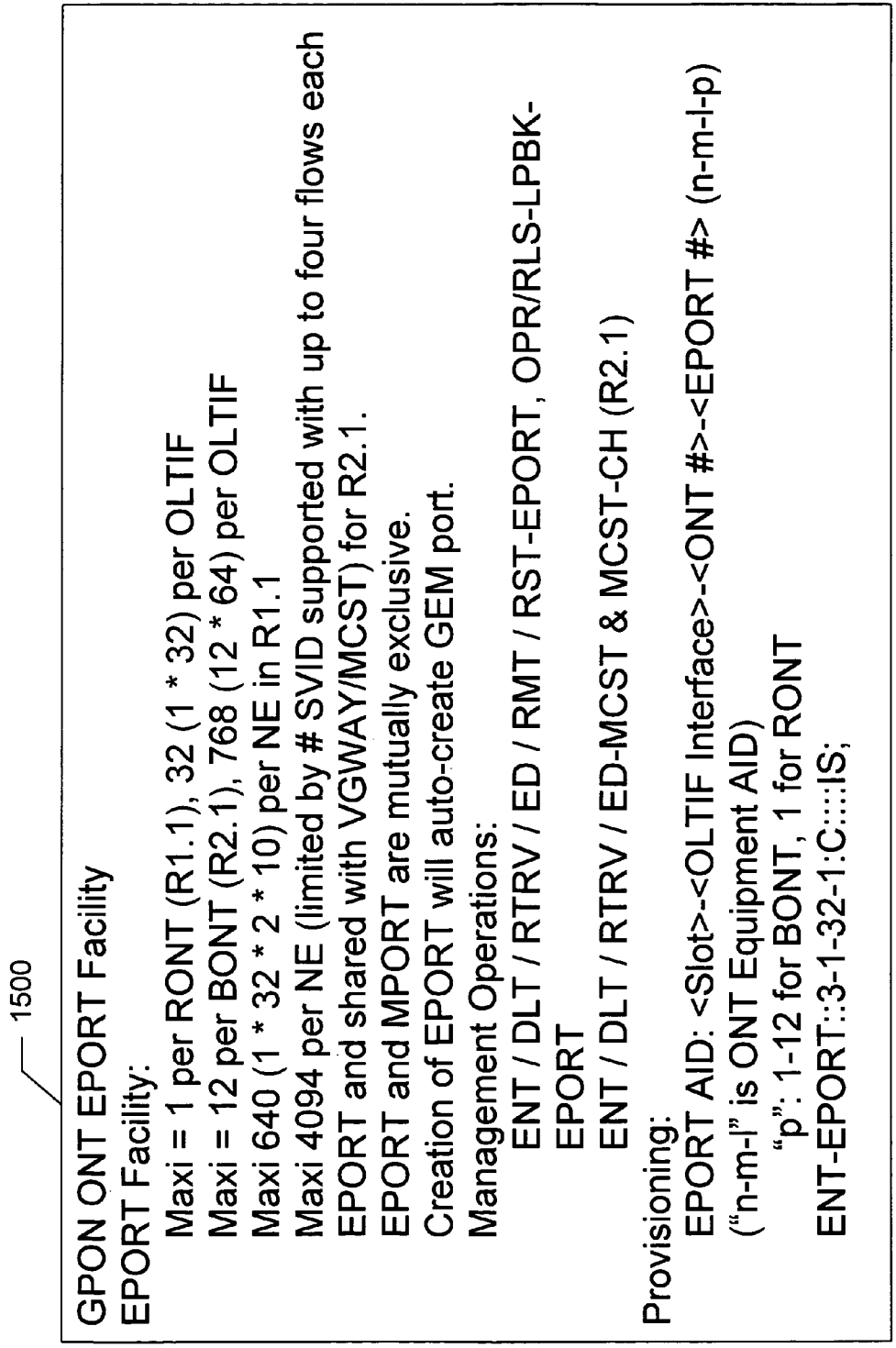
FIG. 15 is an exemplary format of a GPON ONT EPORT Facility.

An exemplary format 1500 of a GPON ONT EPORT Facility is shown in FIG. 15. Format 1500 includes fields for specifying supported GPON ONT EPORTs and for provisioning the GPON ONT EPORTs.

An exemplary format 1600 of a GPON ONT MPORT Facility is shown in FIG. 16. Format 1600 includes fields for specifying supported GPON ONT MPORTs and for provisioning the GPON ONT MPORTs.

An exemplary format 1700 of a GPON ONT GEM Port Facility is shown in FIG. 17. Format 1700 includes fields for specifying supported GPON ONT GEM Ports and for provisioning the GPON ONT GEM Ports.

An exemplary format 1800 of a GPON ONT Voice Port (VPORT) Facility is shown in FIG. 18. Format 1800 includes fields for specifying supported GPON ONT VPORTs and for provisioning the GPON ONT VPORTs.

An exemplary format 1900 of a GPON ONT Radio Frequency (RFPORT) Facility is shown in FIG. 19. Format 1900 includes fields for specifying supported GPON ONT RFPORTs and for provisioning the GPON ONT RFPORTs.

An exemplary format 2000 of a GPON ONT Radio DS1 Facility is shown in FIG. 20. Format 2000 includes fields for specifying supported GPON ONT DS1 ports and for provisioning the GPON ONT DS1 ports.

Figure 21:
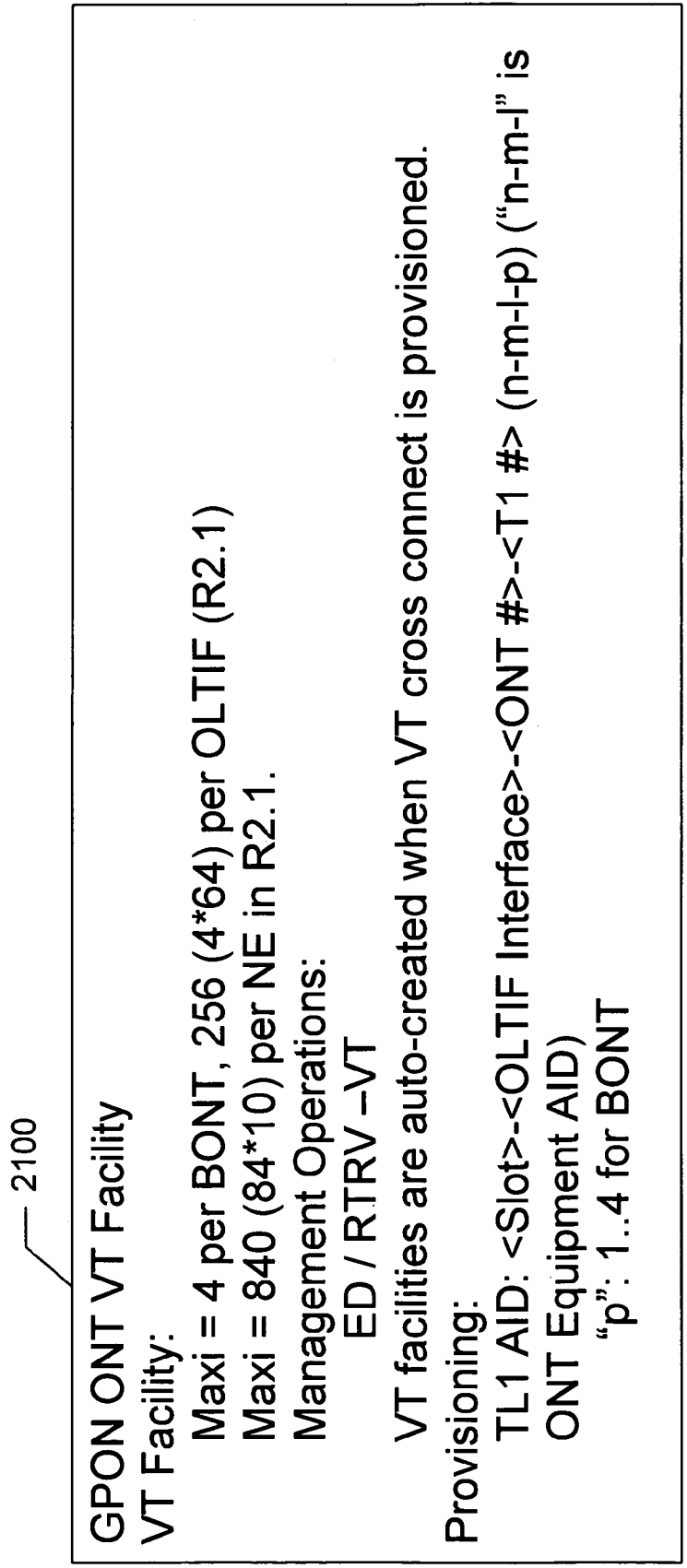
FIG. 21 is an exemplary format of a GPON ONT Virtual Tributary (VT) Facility.

An exemplary format 2100 of a GPON ONT Virtual Tributary (VT) Facility is shown in FIG. 21. Format 2100 includes fields for specifying supported GPON ONT VTs and for provisioning the GPON ONT VTs.

An exemplary format 2200 of supported GPON ONT Binding Facilities is shown in FIG. 22. Format 2200 includes fields for specifying supported FACLINK Facilities and VT Cross Connect Facilities.

An exemplary format 2300 of a GPON ONT FACLINK Facility is shown in FIG. 23. Format 2300 includes fields for specifying the GPON ONT FACLINK Facility.

An exemplary format 2400 of a FACLINK Facility Configuration is shown in FIG. 24. Format 2400 includes fields for specifying the major attributes, system objects, management operations, and TL1 AIDs for the FACLINK Facility Configuration.

Figure 25:
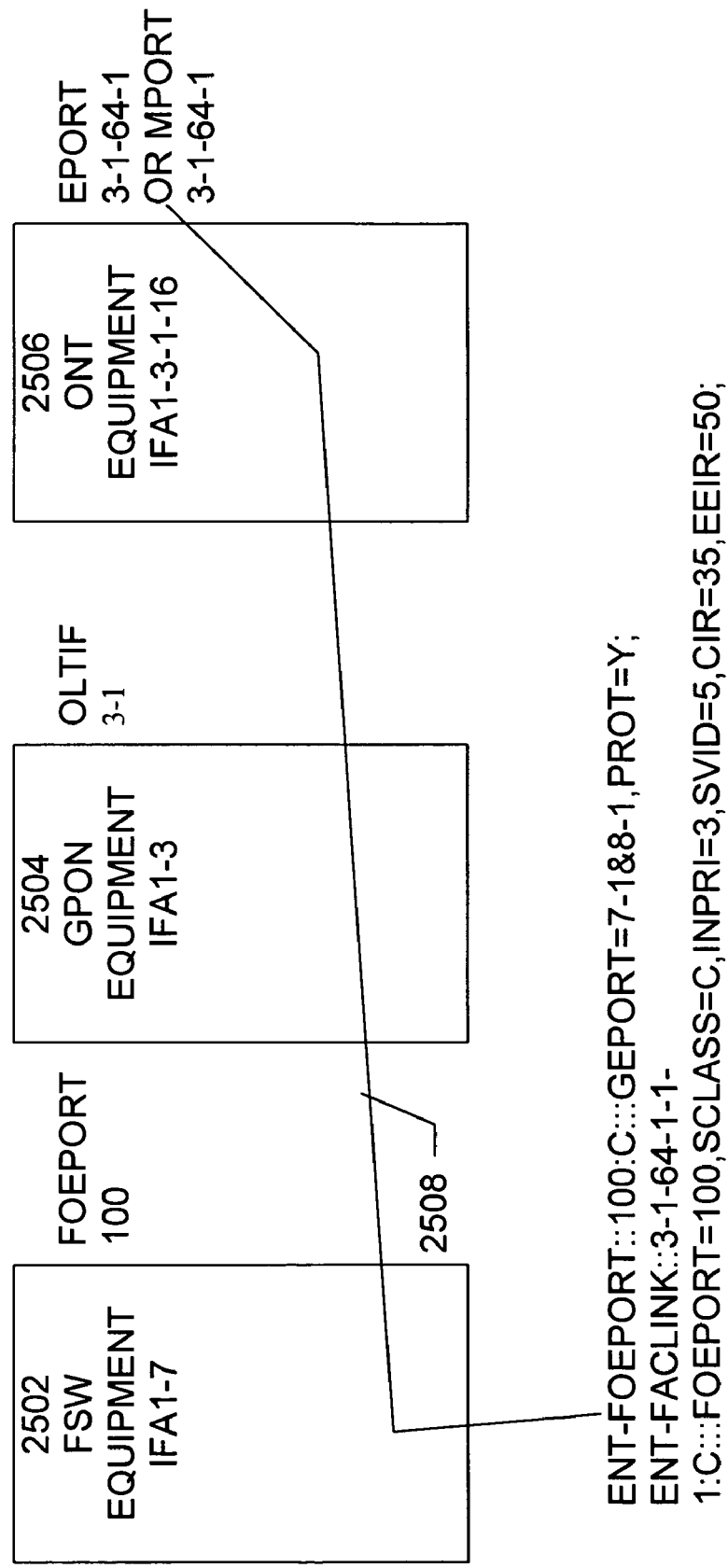
FIG. 25 is block diagram of GPON ONT FACLINK Binding for EPORT.

An exemplary block diagram of GPON ONT FACLINK Binding for EPORT is shown in FIG. 25. As shown, FSW Equipment 2502, GPON Equipment 2504, and ONT Equipment 2506 are bound 2508 using commands such as:
  ENT-FOEPORT::100:C:::GEPORT=7-1&8-1,PROT=Y;
  ENT-FACLINK::3-1-64-1-1-
    1:C:::FOEPORT=100,SCLASS=C,INPRI=3,SVID=5,
  CIR=35,EEIR=50;

An exemplary format 2600 of a GPON ONT VT/VTXcon Facility is shown in FIG. 26. Format 2600 includes fields for specifying the parameters associated with the GPON ONT VT/VTXconFacility.

Figure 27:
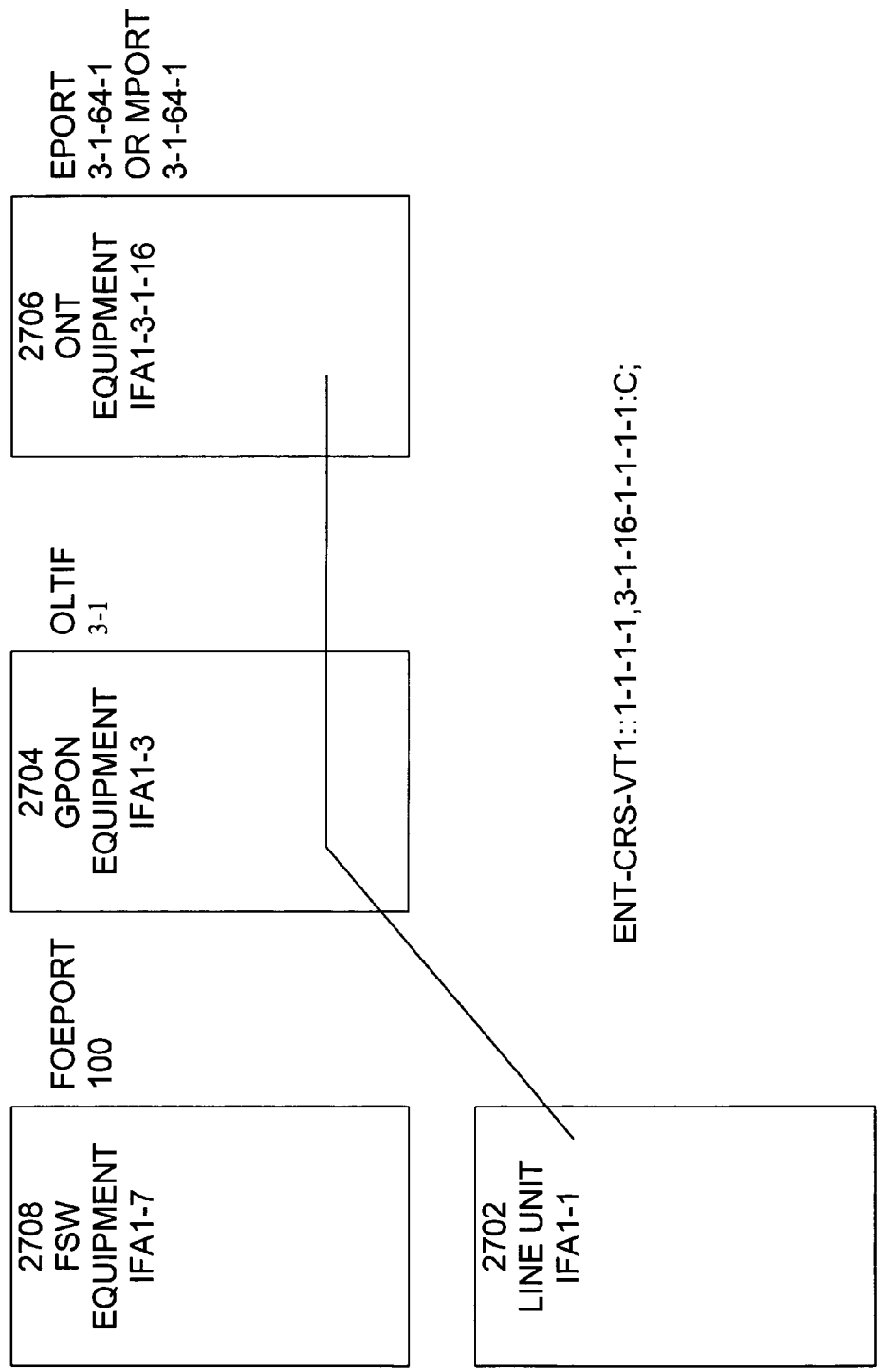
FIG. 27 is block diagram of GPON ONT VT Cross Connect for T1.

An exemplary block diagram of GPON ONT VT Cross Connect for T1 is shown in FIG. 27. As shown, Line Unit 2702 participates in the cross-connect for T1 between GPON Equipment 2704 and ONT Equipment 2706. Also shown is FSW Equipment IFA1-7 2708.

An exemplary format 2800 of Existing Equipment and Facility's AID Changes for GPON Service is shown in FIG. 28. Format 2800 includes fields for specifying the parameters associated with the ONT Equipment AID, EPORT AID, DS1 (T1) AID, FACLINK AID, and VT XCON AID.

An exemplary format 2900 of an ONT Facilities Profile is shown in FIG. 29. When a user provisions ONT Equipment, the facilities under the ONT Equipment can be auto-provisioned. There are default ONT facilities profile defined in the system and user can also define their own profile. Format 2900 is an example of a format used for the PROFILE keyword for ONT profile provisioning. ONT profile AID is set to "ONTabcd" of "b" of facilities supported.

A default PROFILE may be provided for which the system automatically create all the facilities with default keyword value if ONTAUTOP=Y (under ED-SYS). The user may be allowed to modify default PROFILE. Other parameters in the default profile include:
  For ONTF1N1: AID=100 (Reserved AID)
  Default ONTPRFL 100 will set PRFL=E1-V2-R1;
  Create 1 EPORT, 2 VPORT, and 1 RFPORT.
  For ONTF9N1: AID=900 (Reserved AID)
  Default ONTPRFL 900 will set PRFL=E12-T4-V24-S12;
  Create 12 EPORT, 24 VPORT, 4 T1 and 12 VDSL.
There is one default ONT facilities profile per ONT equipment type and there are up to 16 user ONT facilities profile per ONT equipment type.

In order to perform ONT Facilities Profile Configuration, a number of major attributes must be set. These include:
  EPORT/MPORT/T1/VPORT/RFPORT are positional keyword.
  EPORT attributes:
    SPEED, MTU, DUPLEX, AUTONEG, FRCCOLL, MCST, STATUS
  MPORT attributes: STATUS
  T1 attributes:
    LINECDE, FMT, LBO, IBLPBK, FEPM, STATUS
  VPORT attributes:
    STATUS, VGWAY
  RFPORT attributes:
    STATUS System objects, such as ONTPRFL, and Management Operations, such as ONTPRFL: ENT/DLT/RTRV/ED, are supported. Likewise, TL1 AID may have a format such as <ONT Profile #> (AID=n) and may include most significant bit(s) is tied to "ONTabcd" of value "b", "n"=100-116 for ONTF1N1/ONTF1N1 (100 is default, 101-116 are user PROFILE), and "n"=200-216 for ONTF2N1 (200 is default, 201-116 are user PROFILE).

An exemplary format 3000 of an ONTPRFL Behavior is shown in FIG. 30. Format 3000 includes fields for specifying the parameters associated with the ONTPRFL Behavior, such as speed, duplex function, auto-negotiation function, etc., of the EPORT, as well as MPORT, VPORT, and RFPORT parameters.

ONT Equipment auto-provisioning may be implemented using a new new keyword "ONTAUTOP", which will be added in the system configuration. The default will be set to N. The whole NE's ONT facilities auto-creation will use the same ONTAUTOP. If keyword ONTAUTOP=Y, OLTIF and ONT equipment will perform Serial Number/Password auto-discovery and ONT equipment will be auto-created when a valid ONT equipment is inserted with default PROFILE. As ONT Equipment does not have physical position with OLTIF, GPONSU will need to assign the ONT Interface # when the ONT Equipment is auto-created. If keyword ONTAUTOP=N, OLTIF and ONT Equipment will also perform Serial Number/Password auto-discovery. User will manually provision the ONT Equipment. If ONT equipment Serial Number (SN) is not recognized, manual provision of the ONT Equipment should be rejected, and auto-provision of the ONT Equipment should be performed with equipment type=UNKNOWN and raise UNKONT alarm.

ONT Equipment Creation may be performed using a user ONT Profile. If ONTAUTOP=Y, ONT Equipment will be auto-created, ONTPRFL will be set to default PROFILE when ONT Equipment is created. The default PROFILE can be system default or user changed default.

An exemplary format of a user ONT Profile 3100 used for ONT Equipment Creation is shown in FIG. 31. For example, for ONTF1N1:
  ENT-ONTPRFL::110:C:::PRFL=E1-V2-R1;
  Create 1 EPORT, 2 VPORT, and 1 RFPORT.
  ED-ONTPRFL::110:C:::EPORT:MTU=1522;
  ENT-ONTEQPT::IFA1-3-1-
    32:C::ONTF1N1:SERIALNO=456xx,ONTPRFL=110:
  IS;
while for ONTF5N1:
  ENT-ONTPRFL::515:C:::PROFILE=E2-V20-T2-R1;
  Create 2 EPORT, 20 VPORT, 2 T1 and 1 RFPORT
  ED-ONTPRFL::515:C:::T1:LINECDE=AMI;
  ENT-ONTEQPT::IFA1-3-1-
    16:C::ONTF5N1:SERIALNO=123xx,ONTPRFL=515:
  IS;

For ONT Equipment using profile behavior, the system should reject the provision of ONT Equipment if any of the PROFILE facilities specified can not be created, for example, if a limit is reached. Such limitations include BONT/RONT facilities supported limitation for each ONT or T1 maximum limitation per GPONSU (84). Also, an EPORT/MPORT/VPORT/RFPORT maximum limitation per NE. (4094/2560/10240/2560)

Each auto-provision facility from the ONT profile option starts from a lower numbered Port. The user may manually create ONT facilities after ONT equipment is created. ED/RTRV/DLT ONT facilities for those auto-provisioned facilities are allowed. The service provider may activate (UN-LOCK) facilities which default to deactivate (LOCK). When facilities are deactivated, PM monitoring and Fault monitoring will be masked. (No PM/Alarm).

In order to provision the VPORT, the ONT Source IPADDR must be calculated. The user needs to set the IP Subnet Address or the ONT may use the Dynamic Host Configuration Protocol (DHCP) to get the IPADDR for the Voice Gateway (VGWAY). For example:

ENT-VGWAY::1:C:::IPADDR=192.168.0.0; or
ENT-VGWAY::1:C:::DHCPADDR=192.169.1.2;
IPMASK value support only 255.255.0.0 (retrieval only).
IP Subnet Address and DHCPADDR are mutually excluded The IP Address for each ONT will be using the IP Subnet plus the last 16 bits.

11111111 11111111
Bits 15-12 are for GPONSU Slot 3-6 & 9-14
Bits 11-8 are for OLTIF number 1-4
Bits 7-0 are for ONTIF number 1-64
The source IP Address calculation for each ONT:
For VPORT=3-1-1-1&&3-1-1-24, IPADDR=192.168.49.1
For VPORT=7-2-32-1&&7-2-32-24, IPADDR=192.168.114.32
For VPORT=14-4-64-1&&14-4-64-24, IPPADDR=192.168.196.64

For VGWAY System Configuration, the ONT MACADDR is a factory configured MAC address on the ONT Inventory EPROM for source ONT MACADDR. The address may be computed as ENT-VGWAY::1:C:::IPADDR=x.x.x.x, VIPADDR=y.y.y.y,FOEPORT=100,SVID=4093, PRTCL=H248,RSVDBW=500:IS;

For VPORT upstream traffic frame includes source ONT IPADDR, destination VGWAY IPADDR, source ONT MAC-ADDR, learned destination router MACADDR and system SVID. The SE defines the OLT side BW=130K for each VPORT in order for software to perform CAC against OLTIF. The VPORT service default is always off (VGWAY=NULL) until service provider assign a valid VGWAY to VPORT.

For VGWAY System Configuration Provisioning, the address may be computed as: ENT-VGWAY::1:C:::IPADDR=192.168.0.0,VIPADDR=x.x.x.x, FOEPORT=100, SVID=4093,PRTCL=H248,RSVDBW=500.

The Major Attributes include Mandatory keywords, such as IPADDR or DHCPADDR, VIPADDR, FOEPORT, SVID, PRTCL (protocol), and RSVDBW, an IPMASK default of 255.255.0.0 (retrieval only), and an allowed IPADDR value of x.x.0.0. The SVID has to be unique as per NE. The IPADDR, VIPADDR, DHCPADDR, and FOEPORT can not be edited. RSVDBW can only be edited if STATE=OOS. System Objects include VGWAY and the Management Operations include VGWAY: ENT/DLT/RTRV/ED (system level). VGWAY can not be deleted if VGWAY is linked to any VPORT. The TL1 AIDs include AID=n <VGWAY #>.

Figure 32:
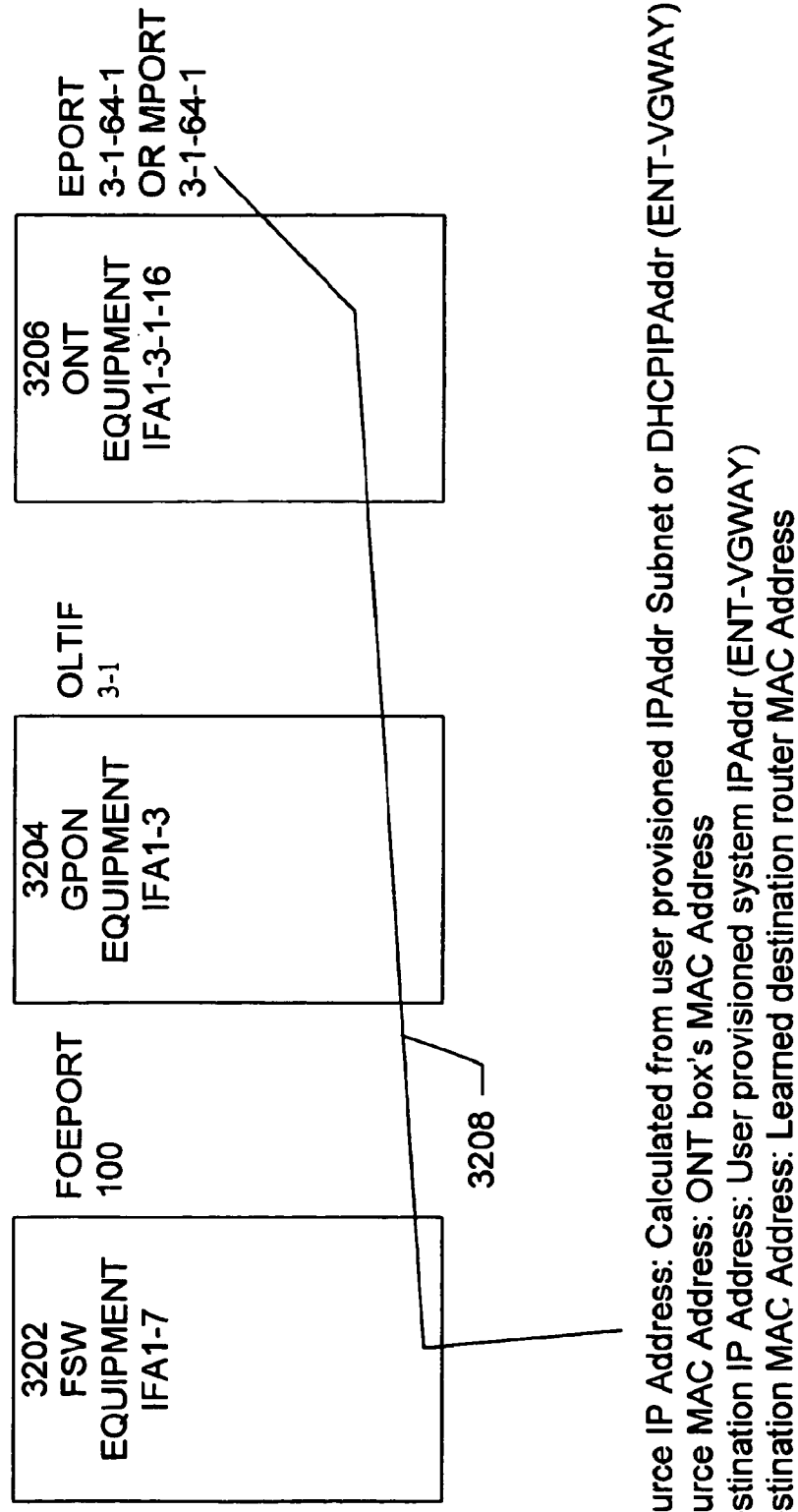
FIG. 32 is an exemplary flow diagram of GPON ONT VPORT Flow.

An example of GPON ONT VPORT Flow is shown in FIG. 32. Data traffic is routed via FSW 3202, GPON Equipment 3204, and ONT Equipment 3206. Parameters 3208, such as the source IP Address may be calculated from user provisioned IPAddr Subnet or DHCPIPAddr (ENT-VGWAY), the source MAC Address may be ONT box's MAC Address, the destination IP Address may be user provisioned system IPAddr (ENT-VGWAY), and the destination MAC Address may be the learned destination router MAC Address.

For Multicast (MCST for IPTV) Configuration, the addresses are computed as ENT-MCST::1:C:::IPADDR=x.x.x.x; or ENT-MCST::1:C::: DHCPADDR=192.168.3.123. If the user does not specify the IPADDR, 192.168.255.255 will be used as default if DHCP (Dynamic HostConfig. Protocol) IP address is not defined. MCST IPADDR and DHCPADDR are mutually excluded, as in ENT-MCST::1:C:::FOEPORT=101,SVID=4092,RS-VDBW=1000:C. The FOEPORT 101 non-link aggregated 1 GE/10 GE MACADDR is used for source MAC for IGMP message and the address computed as ENT-MCST-CH::1&&512:C:::CHBW=2; (CHBW=1.16), ENT-MCST-CH::513&&1024:C:::CHBW=8; (HDTV). For IPTV(IGMP) upstream traffic frame includes source IGMP IPADDR, source IGMP MACADDR, IGMP destination MACADDR & IPADDR per IGMP standard, channel BW and system SVID.

For Multicast System Configuration Provisioning, the address is computed as ENT-MCST::1:C:::DHCPADDR=x.x.x.x,IPADDR=y.y.y.y, FOEPORT=101, SVID=4092,RSVDBW=700. The major attributes include mandatory keywords, such as IPADDR or DHCPADDR, FOEPORT, SVID, RSVDBW. The SVID has to be unique as per NE. The IPADDR, DHCPADDR, and FOEPORT can not be edited. RSVDBW can only be edited if STATE=OOS. The system objects include MCST and the management operations include MCST: ENT/DLT/RTRV/ED (system level). The MCST can not be deleted if the MCST is assigned to any IPTV (under EPORT). The TL1 AIDs include AID=m <MCST #>, where "m": 1.

For Multicast Channel System Configuration Provisioning, the address is computed as ENT-MCST-CH::1&&1024:C:::CHBW=2. The major attributes include mandatory keywords, such as CHBW (Channel Bandwidth): 1.16. The system objects include MCST-CH, the management operations include MCST: ENT/DLT/RTRV/ED, and the TL1 AIDs include AID=M <MCST Channel #>, where "m": 1-1024.

Figure 33:
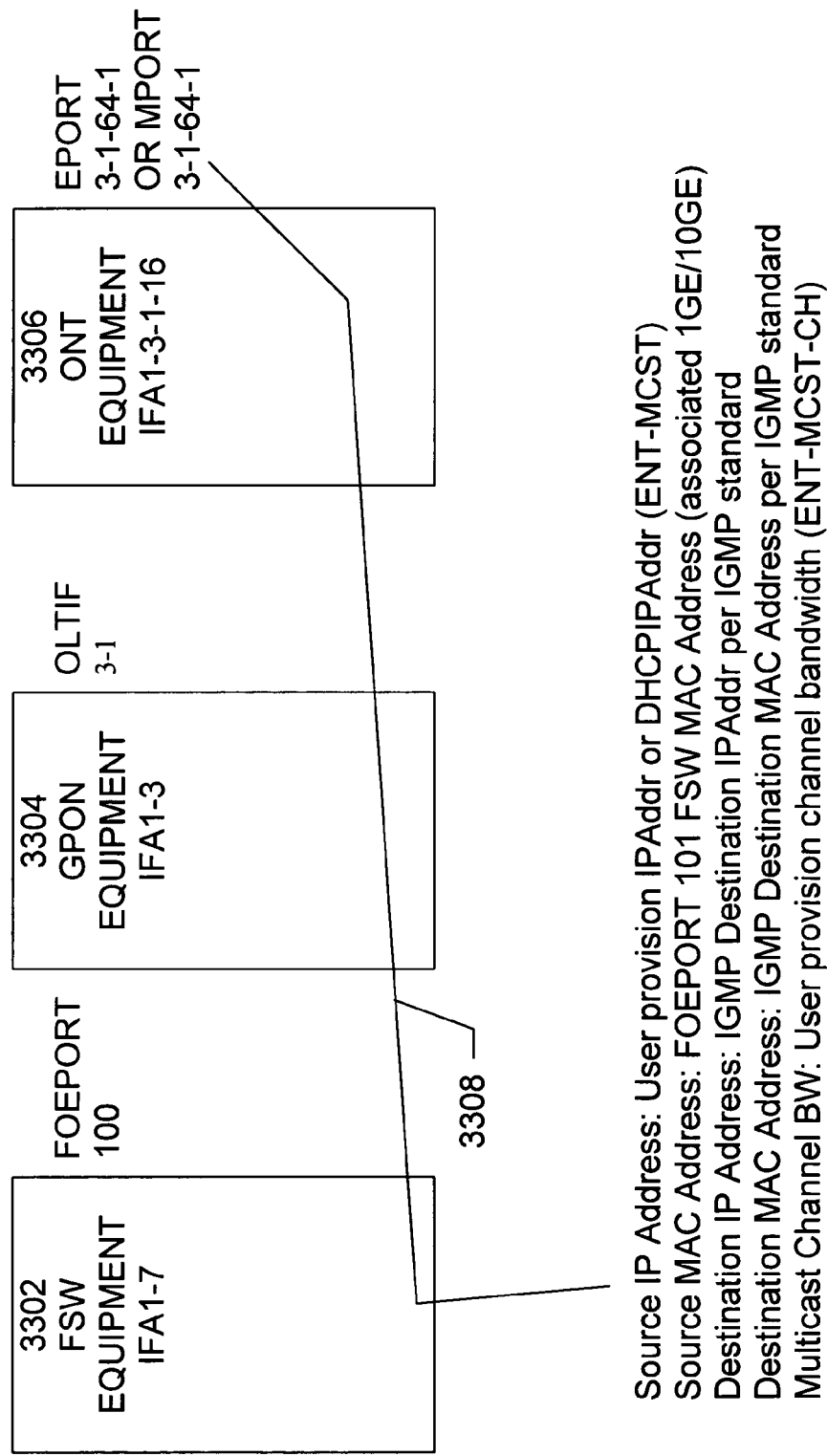
FIG. 33 is an exemplary flow diagram of GPON ONT IPTV Flow.

An example of GPON ONT IPTV Flow is shown in FIG. 33. Data traffic is routed via FSW 3302, GPON Equipment 3304, and ONT Equipment 3306. Parameters 3308, such as the Source IP Address may be user provisioned as IPAddr or DHCPIPAddr (ENT-MCST), the source MAC Address may be FOEPORT 101 FSW MAC Address (associated IGE/1OGE), the destination IP Address may be IGMP Destination IPAddr per IGMP standard, the destination MAC Address may be IGMP Destination MAC Address per IGMP standard, the multicast Channel BW may be user provisioned channel bandwidth (ENT-MCST-CH).

For GPON ONT Configuration Management, each NE supports up to 2560 ONT equipments. Support List, Range and ALL with all the ONT equipment become impossible and unreadable. GPON ONT Configuration Retrieval supports command for ONT EQPT as per GR-831 retrieval such as RTRV-EQPT#OLTIF::<OLTIF AID>:C, and RTRV-EQPT#EQPT::<GPONSU Equipment AID>:C. Commands supported for ONT FAC as per GR-831 retrieval such as RTRV-xxxx#EQPT::<GPONSU Equipment AID>:C, RTRV-xxxx#OLTIF::<OLTIF AID>:C, and RTRV-xxxx#EQPT::<ONT Equipment AID>:C, where "xxxx" includes facilities ONTIF/EPORT/MPORT and T1/VT/VPORT/RFPORT/GEM/FACLINK. For ONT VT XCON as per GR-831 retrieval, supported commands include RTRV-CRS-VT1#EQPT::<GPONSU Equipment AID>:C, RTRV-CRS- VT1#OLTIF::<OLTIF AID>:C, and RTRV-CRS-VT1#EQPT::<ONT Equipment AID>:C.

For GPON ONT Performance Management, each NE supports up to 2560 ONT units. With existing Performance Management, the PM responding, PM reporting, and TCA reporting traffic between MCU and all GPONSU will be increased exponentially. For ONT Facilities (ONTIF/EPORT/VPORT/T1/VT/GEM/FACLINK) PM retrieval can only be supported when the corresponding GPONSU equipment and at least one FSW is in the system. List, Range and All for Timed/Cumulative ONT facilities PM are supported per Slot basis for GPONSU. Commands supported for ONT FAC PM as per GR-831 retrieval include INIT-REG-ALL#EQPT::<GPONSU Equipment AID>:C, INIT-REG-ALL#EQPT::<ONT Equipment AID>:C, RTRV-PM-xxxx#EQPT::<GPONSU Equipment AID>:C, RTRV-PM-xxxx#OLTIF::<OLTIF AID>:C, and RTRV-PM-xxxx#EQPT::<ONT Equipment AID>:C, where "xxxx" includes facilities ONTIF/EPORT/VPORT/T1/VT/GEM/FACLINK. Where the PM is responding, RTRV-TH/SET-TH/ALW-PMREPT/INH-PMREPT/RTRV-MSG for facilities ONTIF, EPORT, VPORT, GEM, T1 and VT are not supported. For the PM reporting/TCA Threshold Crossing, ONT facility (ONTIF, EPORT, VPORT, T1, VT, GEM) does not need to support PM reporting and TCA Threshold Crossing. ONT facility (FACLINK) only support cumulative PM.

For GPON ONT Fault Management, each NE supports up to 2560 ONT equipments. With existing Fault Management, the alarm/event reporting traffic between MCU and all GPONSU will be increased exponentially. Alarm Responding ONT Facilities (ONTIF/EPORT/MPORT/VPORT/RFPORT/T1/VT and GEM) alarm retrieval can only be supported when the corresponding GPONSU equipment and at least one FSW is in the system. List, Range and All ONT facilities Alarm are supported per Slot basis for GPONSU. Support for commands for ONT Equipment alarms and ONT Facility (ONTIF/EPORT/MPORT/T1/VT/VPORT/RFPORT/GEM) alarms as per GR-831 retrieval include RTRV-ALM-ALL#EQPT::<GPONSU or ONT Equipment AID>:C, RTRV-COND-ALL#EQPT::<GPONSU or ONT Equipment AID>:C, RTRV-ALM-xxxx#EQPT::<GPONSU Equipment AID>:C, RTRV-ALM-xxxx#OLTIF::<OLTIF AID>:C, RTRV-ATTR-xxxx#EQPT::<GPONSU Equipment AID>:C, SET-ATTR-xxxx#EQPT::<GPONSU Equipment AID>:C.

In order to support GPON, some changes to the system behaviour must be implemented. For example, GPON supports a distributed architecture in which all GPON databases except GPONSU/FSW equipment will be stored in the FSW instead of the MCU. Therefore, the FSW will act like the MCU for GPON services such as shelf facilities, including OLTIF, GEPORT, and FOEPORT, ONT equipment, and ONT facilities, including EPORT, MPORT, T1, VPORT, RFPORT, GEM, FACLINK, and VT Cross Connect. The behaviors will be changed, such as static retrieval for shelf facilities, ONT equipment and ONT facilities configuration will not be allowed if FSW is not present in the shelf, static retrieval for FSW Cumulative/History PM and alarm will not be allowed if FSW is not presented in the shelf, static retrieval for GPONSU Cumulative/History PM and alarm will not be allowed if FSW and GPONSU are not presented in the shelf, ONT Equipment and ONT facilities alarm will not be automatically reported but a summary alarm will be raised against OLTIF.

An example of an EPORT Service Provision sequence 3400 with AUTOP=Y/ONTAUTOP=Y is shown in FIG. 34. For ENT-EQPT::IFA1-7:C::FSW4X, where SFP Equipment (IFA1-7-1&&IFA1-7-4) are auto-created and GEPORT (7-1&&7-4) are auto-created. For ENT-EQPT::IFA1-8:C::FSW4X, SFP Equipment (IFA1-8-1&&IFA1-8-4) are auto-created and GEPORT (8-1&&8-4) are auto-created. For ENT-EQPT::IFA1-3:C::GPONF2N1::IS, OLTIFs (3-1&&3-2) are auto created. For ENT-ONTEQPT::IFA1-3-1-16:C::ONTFINI:SERIALNO=123xx:IS, this is not a user initiated command but is automatically created, ONT Interface (#16) is automatically assigned by the OLTIF, and the ONT Default Profile AID 100 is used to created ONTIF (3-1-16-1), EPORT (3-1-16-1), RFPORT (3-1-16-1), and VPORT (3-1-16-1&&3-1-16-2) are auto-created with STATUS=LOCK. Additional commands include ENT-FOEPORT::100:C:::GEPORT=7-1, ED-EPORT::3-1-16-1:C:::STATUS=UNLOCK, and ENT-FACLINK::3-1-16-1:C:::FOEPORT=100,SCLASS=A,PRI=3,CIR=35,SVID=5. This command binds GEM port (autocreated3-1-16-1) and FOEPORT (100).

An example of a VPORT Service Provision sequence 3500 (without DHCP) is shown in FIG. 35.

An example of a Multicast (IPTV) Service Provision sequence 3600 (with DHCP) is shown in FIG. 36.

An example of a T1 Service Provision sequence 3700 is shown in FIG. 37.

The FSW/GPONSU SWDL involves the DCC downloading both GPONSU and ONT (one PGM for all ONTs) PGM files when the user issues CPY-FILE/CPY-MEM. The GPONSU takes care of downloading from OLT to each ONT using G984 protocol messages. When the user issues INIT-SYS for NE to upgrade, each specific GPONSU and all underline ONT Equipments will be downloaded to the new PGM. The FVM (Database Version Mismatch) alarm will only report against GPONSU/FSW. The Alarm ONTFWDL against GPONSU will be raised if one or more ONT FWDL for this specific GPONSU is still in progress. INIT-EQPT is issued to perform the GPONSU download:

If FORCE=Y, allow to download and activate the new PGM.

If FORCE=N, allow to download and activate the new PGM only, where the GPONSU is in OOS state and the GPONSU does not have outstanding ONTFWDL alarm.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A system for managing an optical network comprising:
   means for provisioning the optical network for data, voice, radio, multicast Internet Protocol Television (IPTV) and port protection;
   means for creating a unit of the optical network; and
   means for arranging link aggregation to form at least one link-aggregation comprising a plurality of link-aggregated ports of a frame switching equipment unit of the optical network, and to further provision a plurality of ports that are non-link aggregated ports in the frame switching equipment unit of the optical network;
   wherein the link aggregation arranging means comprises means for arranging link aggregation in the frame switching equipment unit of the optical network using information defining operational parameters of the link aggregation for the frame switching equipment unit of the optical network, wherein the information defining operational parameters of the link aggregation is a defined profile for the frame switching equipment unit comprising ports of the frame switching equipment unit of the optical network included in the link aggregation, a speed of the link aggregation, a format of the link aggregation, and a protection of the link aggregation.

2. The system of claim 1, wherein the creating means comprises:
means for creating a unit of the optical network using information defining operational parameters of the optical network in communicating with the created unit.

3. The system of claim 2, wherein the information defining operational parameters of the unit of the optical network comprises at least one of:
a network address of the unit of the optical network, a type of the unit of the optical network, a network function of the unit of the optical network, a protection of the unit of the optical network, and a port of the unit of the optical network.

4. A method for managing an optical network comprising:
provisioning the optical network for data, voice, radio, multicast Internet Protocol Television (IPTV) and port protection;
creating a unit of the optical network;
and
arranging link aggregation to form at least one link-aggregation comprising a plurality of link-aggregated ports of a frame switching equipment unit of the optical network, and to further provision a plurality of ports that are non-link aggregated ports in the frame switching equipment unit of the optical network;
wherein the link aggregation arranging means comprises means for arranging link aggregation in the frame switching equipment unit of the optical network using information defining operational parameters of the link aggregation for the frame switching equipment unit of the optical network, wherein the information defining operational parameters of the link aggregation is a defined profile for the Frame switching equipment unit comprising ports of the frame switching equipment unit of the optical network included in the link aggregation, a speed of the link aggregation, a format of the link aggregation, and a protection of the link aggregation.

5. The method of claim 4, wherein the creating comprises:
creating a unit of the optical network using information defining operational parameters of the optical network in communicating with the created unit.

6. The method of claim 5, wherein the information defining operational parameters of the unit of the optical network comprises at least one of:
a network address of the unit of the optical network, a type of the unit of the optical network, a network function of the unit of the optical network, a protection of the unit of the optical network, and a port of the unit of the optical network.

7. A system for managing an optical network comprising:
a provisioning device for provisioning the optical network for data, voice, radio, multicast Internet Protocol Television (IPTV) and port protection;
a device for creating a unit of the optical network; and
a device for arranging link aggregation to form at least one link-aggregation comprising a plurality of link-aggregated ports of a frame switching equipment unit of the optical network, and to further provision a plurality of ports that are non-link aggregated ports in the frame switching equipment unit of the optical network;
wherein the link aggregation arranging means comprises means for arranging link aggregation in the frame switching equipment unit of the optical network using information defining operational parameters of the link aggregation for the frame switching equipment unit of the optical network, wherein the information defining operational parameters of the link aggregation is a defined profile for the Frame switching equipment unit comprising ports of the frame switching equipment unit of the optical network included in the link aggregation, a speed of the link aggregation, a format of the link aggregation, and a protection of the link aggregation.

8. The system of claim 7, wherein the device for creating a unit of the optical network comprises:
a device for creating a unit of the optical network using information defining operational parameters of the optical network in communicating with the created unit.

9. The system of claim 8, wherein the information defining operational parameters of the unit of the optical network comprises at least one of:
a network address of the unit of the optical network, a type of the unit of the optical network, a network function of the unit of the optical network, a protection of the unit of the optical network, and a port of the unit of the optical network.

* * * * *